(12) United States Patent
Toyoda et al.

(10) Patent No.: US 7,095,560 B2
(45) Date of Patent: Aug. 22, 2006

(54) DIFFRACTIVE OPTICAL DEVICE, REFRACTIVE OPTICAL DEVICE, ILLUMINATION OPTICAL SYSTEM, EXPOSURE APPARATUS AND EXPOSURE METHOD

(75) Inventors: Mitsunori Toyoda, Tokyo (JP); Osamu Tanitsu, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/860,161

(22) Filed: Jun. 4, 2004

(65) Prior Publication Data

US 2004/0263977 A1 Dec. 30, 2004

Related U.S. Application Data

(63) Continuation-in-part of application No. PCT/JP02/12729, filed on Dec. 4, 2002.

(30) Foreign Application Priority Data

Dec. 12, 2001 (JP) ............................. 2001-378001
Dec. 12, 2001 (JP) ............................. 2001-378063

(51) Int. Cl.
*G02B 5/18* (2006.01)
*G02B 27/10* (2006.01)
*G03B 27/54* (2006.01)

(52) U.S. Cl. ...................... 359/558; 359/619; 359/629; 355/53; 355/67

(58) Field of Classification Search ................ 359/558, 359/619, 629; 362/277, 16, 268; 355/53, 355/67, 71
See application file for complete search history.

(56) References Cited

U.S. PATENT DOCUMENTS

| | | | |
|---|---|---|---|
| 4,851,882 A | 7/1989 | Takahashi et al. | 355/67 |
| 5,703,675 A | 12/1997 | Hirukawa et al. | 355/53 |
| 5,719,704 A | 2/1998 | Shiraishi et al. | 359/558 |
| 6,095,667 A | 8/2000 | Kamihara et al. | 362/311 |
| 6,211,944 B1 | 4/2001 | Shiraishi | 355/53 |
| 6,563,567 B1 | 5/2003 | Komatsuda et al. | 355/71 |
| 6,583,855 B1 | 6/2003 | Krikke et al. | 355/67 |
| 6,587,182 B1 | 7/2003 | Goto | 355/71 |
| 2001/0043318 A1 | 11/2001 | Mori | 355/53 |
| 2001/0055107 A1 | 12/2001 | Tsuji | 355/67 |

(Continued)

FOREIGN PATENT DOCUMENTS

JP         A 07-142327        6/1995

(Continued)

*Primary Examiner*—Scott J. Sugarman
*Assistant Examiner*—M. Hasan
(74) *Attorney, Agent, or Firm*—Oliff & Berridge PLC

(57) ABSTRACT

An illumination optical system having a more simplified structure forms various quadrupole-shaped secondary light sources with two-time rotational symmetry with respect to an optical axis. The apparatus can provide illumination conditions that differ in two perpendicular directions on a radiation-receiving plane. In order to form a secondary light source with a quadrupole-shaped light intensity distribution on an illumination pupil plane, a diffractive optical device is provided in which an entrance light beam is converted into four light beams, and a light beam having a shape of four points centered about the optical axis is formed in a far field. The diffractive optical device is provided with a first diffractive optical member that is rotatable about a first axis parallel to the optical axis, and a second diffractive optical member that is rotatable about a second axis parallel to the optical axis, and that is arranged adjacent to the first diffractive optical member. A refractive optical device having first and second refractive optical members accomplishes similar results.

47 Claims, 22 Drawing Sheets

U.S. PATENT DOCUMENTS

| | | | |
|---|---|---|---|
| 2002/0085276 A1 | 7/2002 | Tanitsu et al. | 359/432 |
| 2003/0038931 A1 | 2/2003 | Toyoda et al. | 355/67 |

FOREIGN PATENT DOCUMENTS

| | | |
|---|---|---|
| JP | A 2000-106346 | 4/2000 |
| JP | A 2000-277421 | 10/2000 |
| JP | A 2001-85293 | 3/2001 |
| JP | A 2001-176766 | 6/2001 |
| JP | A 2001-284212 | 10/2001 |
| JP | A 2001-338861 | 12/2001 |
| JP | A 2002-25896 | 1/2002 |
| JP | A 2002-231619 | 8/2002 |

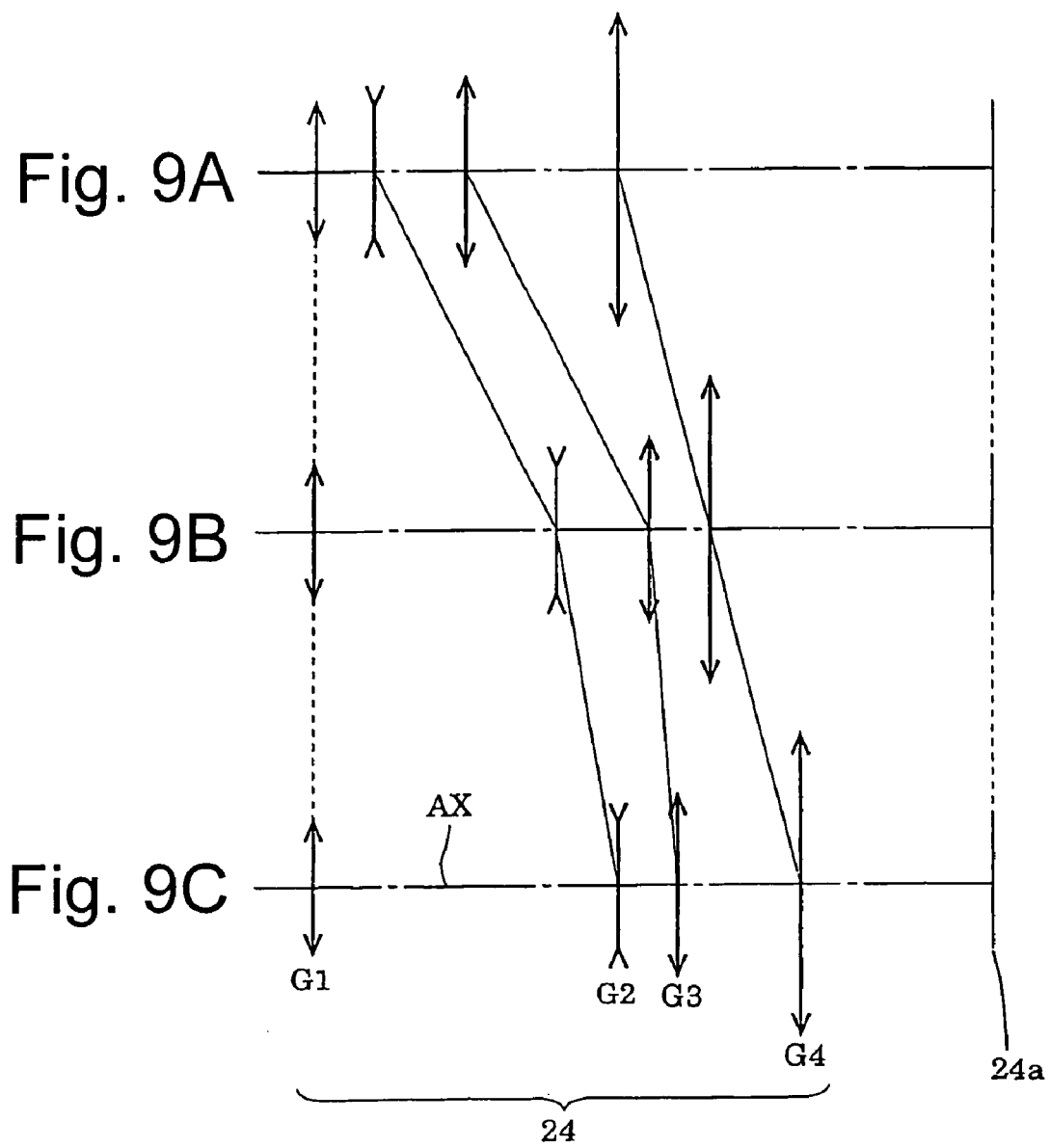

DIFFRACTIVE OPTICAL DEVICE, REFRACTIVE OPTICAL DEVICE, ILLUMINATION OPTICAL SYSTEM, EXPOSURE APPARATUS AND EXPOSURE METHOD

INCORPORATION BY REFERENCE

This is a Continuation-in-Part of International Application No. PCT/JP02/12729 filed Dec. 4, 2002, the entire disclosure of which is incorporated herein by reference in its entirety. The disclosures of the following priority applications also are herein incorporated by reference in their entireties: Japanese Patent Application No. 2001-378001 filed Dec. 12, 2001 and Japanese Patent Application No. 2001-378063 filed Dec. 12, 2001.

BACKGROUND OF THE INVENTION

1. Field of Invention

This invention relates to diffractive optical devices, refractive optical devices, illumination optical system, exposure apparatus, and exposure methods. In particular, this invention relates to illumination optical system suitable for manufacturing micro-devices, such as semiconductor elements, imaging elements, liquid crystal display elements, and thin film magnetic heads, using lithography processes.

2. Description of Related Art

In typical exposure apparatus of this kind, a secondary light source is formed substantially as a planar light source composed from many light sources, via a fly's eye lens that functions as an optical integrator. A light beam from the secondary light source (the light beam from the secondary light source actually is composed of multiple light beams from the many light sources that form the secondary light source) enters a condenser lens after being limited through an aperture diaphragm positioned near a back focal plane of the fly's eye lens.

The light beams collected by the condenser lens superimposingly illuminate a mask on which a predetermined pattern has been formed. The light that has passed the pattern on the mask forms an image on a wafer through a projection optical system. As a result, a mask pattern is projected and exposed (transferred) onto the wafer. The pattern formed on the mask is highly integrated. Thus, it is desirable to obtain a uniform illumination distribution on the wafer in order to accurately transfer the minute pattern onto the wafer.

Accordingly, a technology that forms a circular secondary light source on the back focal plane of the fly's eye lens and varies coherency σ (σ=diameter of aperture diaphragm/diameter of pupil of the projection optical system, or σ=numerical aperture on the exit side of the illumination optical system/numerical aperture of the entrance side of the projection optical system) of illumination by changing the size thereof, has been used. In addition, a technology that forms an annular or quadrupole secondary light source on the back focal plane of the fly's eye lens to improve depth of focus (DOF) and resolution of the projection optical system, has been used.

However, in the above-described conventional technologies, the cross-sectional shape of the light beam entering a point on the mask that is the illuminated surface is in the same positional relationship with respect to the two orthogonal directions on the mask in the case of the conventional circular illumination based on the circular secondary light source, as well as in the case of the conventional modified illumination based on the annular or quadrupole secondary light source (annular illumination or quadrupole illumination). In other words, in the conventional technologies, the illumination conditions are the same for the two orthogonal directions on the illuminated surface. As a result, it is not possible to realize the most optimum illumination conditions at the two orthogonal directions on the mask when the mask pattern has directionality (i.e., has characteristics/features that are different in the two orthogonal directions).

In particular, in the case of the quadrupole illumination where a quadrupole secondary light source composed from four planar light sources centered about the optical axis is formed, changing the size of all of the planar light sources and their distance from the optical axis (measured from the center of each planar light source) is disclosed in Japanese Laid-Open Patent Application No. 2001-85293 (and its corresponding European Laid-Open Application No. 1014196), for example. However, in the conventional technologies, although the size of all of the planar light sources composing the quadrupole secondary light source in the quadrupole illumination and their distance from the optical axis can be changed, various quadrupole secondary light sources have a form of two-time rotational symmetry (rotational symmetry with respect to two orthogonal axes) with respect to the optical axis by independently or continuously changing the angular position of the planar light sources.

It is proposed in Japanese Laid-Open Patent Application No. 2002-231619, for example, to form various quadrupole secondary light sources having two-time rotational symmetry with respect to the optical axis by independently or continuously changing the angular position of the planar light sources using an axicon system. However, the axicon is difficult to manufacture from fluorite, due to the limited ability to process fluorite, and thus, the manufacturing cost becomes extremely high. Accordingly, there is a demand for a technology that forms various quadrupole secondary light sources having two-time rotational symmetry with respect to the optical axis by independently or continuously changing the angular position of each planar light source using a simple structure without using an axicon system.

SUMMARY OF THE INVENTION

This invention considered the above-described problems, and has as a first object to form various quadrupole secondary light sources having two-time rotational symmetry with respect to the optical axis by independently and continuously changing the angular position of each planar light source based on a simple structure, and to realize illumination conditions that are different from each other in the two orthogonal directions on the illuminated surface.

On the other hand, as the level of integration of semiconductor elements and the like has increased, the resolving power (resolution) required for the projection optical system of an exposure apparatus also has increased. To meet the demand of the resolution of the projection optical system, it is desirable to shorten the wavelength of illumination light (exposure light). However, when the wavelength of the illumination light is shortened, absorption of that light by light transmissive members can become significant. In addition, when the wavelength of the illumination light is shortened, because of the absorption of that light by air (oxygen), it is desirable to purge an illumination light path and replace it with a gas having a low light absorption rate, or to maintain it substantially in a vacuum.

Moreover, to achieve the modified illumination (e.g., annular illumination or quadrupole illumination) by limiting the shape of the secondary light source to annular or quadrupole, if the light beam from a relatively large secondary light source formed by a fly's eye lens is merely limited by an aperture diaphragm having an annular or quadrupole aperture, some parts of the light beam from the secondary light source are blocked by the aperture diaphragm, and thus cannot contribute to the illumination (exposure). As a result, illuminance (exposure intensity) on the mask and the wafer decreases, and the throughput of the exposure apparatus is lowered, due to the loss of light amount caused by the aperture diaphragm.

As such, to reduce the loss of light amount caused by an aperture diaphragm, a structure has been proposed in which a light beam that has been converted to an annular or quadrupole shape enters a fly's eye lens through an optical system having a relatively complex structure including a diffractive optical element and the like to form annular or quadrupole secondary light sources at the exit side of the fly's eye lens. However, in the illumination optical system having this relatively complex structure, because the number of light transmissive members becomes large, and because the illumination light path becomes long, the space that needs to be purged becomes large and the loss of light amount due to the absorption of light in the illumination light path occurs.

This invention considers the above-described problems, and has as a second object to achieve modified illumination, such as annular illumination and quadrupole illumination, while limiting the loss of light amount due to the absorption of light in the illumination light path, by making the device compact in accordance with a simple structure having few members and a shorter illumination light path.

To achieve the first object, according to a first aspect of the invention, a diffractive optical device is provided that is used for an illumination optical system for illuminating an illuminated surface. The diffractive optical device converts an incident light beam into four light beams for forming a secondary light source having a quadrupole light intensity distribution on an illumination pupil plane. The diffractive optical device includes a first diffractive optical member that is rotatable about a first axis that is parallel to an optical axis of the illumination optical system, and a second diffractive optical member that is rotatable about a second axis that is parallel to the optical axis and displaced from the first axis in an orthogonal plane that is orthogonal to the optical axis so as to be adjacent to the first diffractive optical member.

According to a preferred embodiment of this first aspect of the invention, the first axis and the second axis have a positional relationship that is symmetrical about the optical axis in the orthogonal plane. In addition, it is preferred to further provide a third diffractive optical member that is rotatable about a third axis that is parallel to the optical axis and positioned within the orthogonal plane so as to be adjacent to the first diffractive optical member or the second diffractive optical member, and a fourth diffractive optical member that is rotatable about a fourth axis that is parallel to the optical axis and that is positioned within the orthogonal plane so as to be adjacent to the third diffractive optical member, and adjacent to the second diffractive optical member or the first diffractive optical member. In this case, it is preferred that a rectangle formed by connecting the first axis, the second axis, the third axis and the fourth axis in the orthogonal plane forms a square centered about the optical axis.

Furthermore, to achieve the above-described first object, according to a second aspect of the invention, a diffractive optical device is provided that is used for an illumination optical system for illuminating an illuminated surface, and that converts an incident light beam into four light beams for forming a secondary light source having a quadrupole light intensity distribution on an illumination pupil plane. The diffractive optical device includes a first diffractive optical member that is rotatable about a predetermined axis that is parallel to an optical axis of the illumination optical system, and a second diffractive optical member that is rotatable about the predetermined axis. In addition, in the first diffractive optical member and the second diffractive optical member, at least a part of annular regions defined by a plurality of concentric circles are formed so as to be substantially the same. Furthermore, in the first diffractive optical member, diffraction surfaces are formed in odd-numbered regions from the center among the annular regions, and in the second diffractive optical member, diffraction surfaces are formed in even-numbered regions from the center among the annular regions.

According to a preferred embodiment of this second aspect of the invention, a radial dimension of the annular regions of the first and second diffractive optical members are formed substantially equal to each other. It also is preferable that the first diffractive optical member and the second diffractive optical member are positioned so as to be adjacent to each other along the predetermined axis. Moreover, it is preferable that the predetermined axis is coaxial with the optical axis of the illumination optical system.

In addition, according to a preferred embodiment of the second aspect of the invention, it also is preferable that entire surfaces of the first diffractive optical member and the second diffractive optical member include the annular regions defined by the plurality of concentric circles. It also is preferable that a part of surfaces of each of the first and second diffractive optical members includes the annular regions, and at least one of a diffraction surface and a refraction surface for converting an incident light beam into a predetermined light beam is formed in portions of the first and second diffractive optical members where the annular regions are not provided.

Furthermore, to achieve the above-described first object, according to a third aspect of the invention, a refractive optical device is provided that is used for an illumination optical system for illuminating an illuminated surface, and that converts an incident light beam into four light beams for forming a secondary light source having a quadrupole light intensity distribution on an illumination pupil plane. The refractive optical device includes a first refractive optical member that is rotatable about a first axis that is parallel to an optical axis of the illumination optical system, and a second refractive optical member that is rotatable about a second axis that is parallel to the optical axis and positioned within a plane orthogonal to the optical axis so as to be adjacent to the first refractive optical member.

According to a preferred embodiment of this third aspect of the invention, the first axis and the second axis have a positional relationship in the orthogonal plane that is symmetrical about the optical axis. In addition, it is preferable to further provide a third refractive optical member that is rotatable about a third axis that is parallel to the optical axis and positioned within the orthogonal plane so as to be adjacent to the first refractive optical member or the second refractive optical member, and a fourth refractive optical member that is rotatable about a fourth axis that is parallel to the optical axis and positioned within the orthogonal plane so as to be adjacent to the third refractive optical member, and adjacent to one of the second refractive optical member and the first refractive optical member. In this case, it is preferable that a rectangle formed by connecting the first axis, the second axis, the third axis and the fourth axis in the orthogonal plane forms a square centered about the optical axis.

Moreover, to achieve the first object, according to a fourth aspect of the invention, a refractive optical device is provided that is used for an illumination optical system for illuminating an illuminated surface, and that converts an incident light beam into four light beams for forming a secondary light source having a quadrupole light intensity distribution on an illumination pupil plane. The refractive optical device includes a first refractive optical member that is rotatable about a predetermined axis that is parallel to an optical axis of the illumination optical system, and a second refractive optical member that is rotatable about the predetermined axis. In addition, in the first refractive optical member and the second refractive optical member, at least a part of annular regions defined by a plurality of concentric circles are formed so as to be substantially the same. Furthermore, in the first refractive optical member, refraction surfaces are formed in odd-numbered regions from the center among the annular regions, and in the second refractive optical member, refraction surfaces are formed in even-numbered regions from the center among the annular regions.

According to a preferred embodiment of the fourth aspect of the invention, a radial dimension of the annular regions of the first and second refractive optical members are substantially equal to each other. In addition, it also is preferable that the first refractive optical member and the second refractive optical member are position so as to be adjacent to each other along the predetermined axis. Moreover, it is preferable that the predetermined axis is coaxial with the optical axis of the illumination optical system.

In addition, according to a preferred embodiment of the fourth aspect of the invention, entire surfaces of the first refractive optical member and the second refractive optical member include the annular regions defined by the plurality of concentric circles. It also is preferable that a part of surfaces of each of the first and second refractive optical members includes the annular regions, and at least one of a diffraction surface and a refraction surface for converting the incident light beam into a predetermined light beam is formed at portions of the first and second refractive optical members where the annular regions are not provided. Furthermore, in the fourth aspect of the invention, it is preferable that a prism array is formed on the refraction surface in the regions of the first refractive optical member and the second refractive optical member.

According to a fifth aspect of the invention, an illumination optical system is provided for illuminating an illuminated surface, and includes the diffractive optical device according to the first or second aspects of the invention, or the refractive optical device according to the third or fourth aspects of the invention, that forms a four-point or quadrupole light beam centered about the optical axis in a far field by converting the incident light beams into four light beams, to form a secondary light source having quadrupole light intensity distribution on an illumination pupil plane.

According to a preferred embodiment of the fifth aspect of the invention, the illumination optical system includes a light source that supplies the light beam, and an angular light beam forming device that causes the light beam supplied from the light source to enter a first predetermined surface by converting the light beam into a light beam having plural angular components with respect to the optical axis. The illumination optical system also includes an illumination field forming device that includes the diffractive optical device or the refractive optical device for forming four illumination fields about the optical axis on a second predetermined surface based on the light beam having plural angular components that entered the first predetermined surface. The illumination optical system also includes an optical integrator that forms a quadrupole secondary light source having substantially the same light intensity distribution as the four illumination fields, based on the light beam from the four illumination fields formed on the second predetermined surface, and a light guiding optical system that guides the light beam from the optical integrator to the illuminated surface.

Moreover, according to a preferred embodiment of the fifth aspect of the invention, the angular light beam forming device has a dispersing light beam forming element for converting a parallel light beam supplied from the light source into a light beam that disperses at plural angles with respect to the optical axis, and a first optical system for collecting the dispersed light beam formed though the dispersing light beam forming element, and for guiding that beam to the first predetermined surface. In this case, it is preferable that the first optical system has a first magnification changing optical system for changing a size of each planar light source without changing a distance between the optical axis and each center of the four planar light sources. In addition, in this case, it is preferable that the first magnification changing optical system has an afocal lens that makes the dispersing light beam forming element and the first predetermined surface substantially optically conjugate.

Alternatively, according to a preferred embodiment of the fifth aspect of the invention, the angular light beam forming device has a wavefront split type optical integrator structured from a first optical element array having a plurality of first unit optical elements arranged two-dimensionally, and a second optical element array having a plurality of second unit optical elements arranged to optically correspond to the plurality of first unit optical elements. In addition, a back focal plane of the wavefront split type optical integrator is positioned on or near the first predetermined surface. In this case it is preferable that a gap between the first optical element array and the second optical element array is variable so as to change the size of each planar light source without changing the distance between the optical axis and each center of the four planar light sources.

In addition, according to a preferred embodiment of the fifth aspect of the invention, the illumination optical system further includes a second optical system for directing the light beam from the diffractive optical device or the refractive optical device to the second predetermined surface. In this case, it is preferable that the second optical system has a second magnification changing optical system for similarly expanding and reducing the secondary light source. In addition, in this case, it is preferable that the second magnification changing optical system has a zoom lens that places the diffractive optical device or the refractive optical device and the second predetermined surface in a substantially Fourier transform relationship.

To achieve the above-described second object, according to a sixth aspect of the invention, an illumination optical system is provided for illuminating an illuminated surface, and includes a light source that supplies a light beam, and an angular light beam forming device that includes an optical member having a plurality of optical units arranged two-dimensionally and that causes the light beam supplied from the light source to enter a first predetermined surface by converting the light beam into a light beam having a predetermined dispersion angle with respect to the optical axis. The illumination optical system also includes an illumination field forming device that includes a diffractive optical device for forming a predetermined illumination field about the optical axis on a second predetermined surface based on the light beam having a predetermined dispersion angle that entered the first predetermined surface. The illumination optical system also includes an optical integrator for forming a secondary light source having substantially the same light intensity distribution as the predetermined illumination field, based on the light beam from the predetermined illumination field formed on the second predetermined surface, and a magnification changing optical system positioned in an optical path between the illumination field forming device and the optical integrator. In the illumination optical system: the angular light beam forming device varies the predetermined dispersion angle; the predetermined illumination field on the second predetermined surface includes at least one of four illumination fields centered about the optical axis, two illumination fields centered about the optical axis, and an annular illumination field; and the plurality of unit elements and the diffractive optical element are positioned adjacent to each other.

According to the sixth aspect of the invention, the predetermined dispersion angle supplied by the angular light beam forming device is continuously variable. In this case, it is preferable that the optical member of the angular light beam forming device has a microlens array or a fly's eye lens. Moreover, in this case, it is preferable that the optical member of the angular light beam forming device has a plurality of microlens arrays or fly's eye lenses with variable gaps therebetween.

In addition, according to the sixth aspect of the invention, the predetermined dispersion angle supplied by the angular light beam forming device also may be discretely variable. In this case, it is preferable that the angular light beam forming device includes a plurality of optical members having dispersion angles that differ from each other, and that are replaceable with each other to change the dispersion angle. Furthermore, it is preferable that each of the plurality of optical members of the angular light beam forming device has a microlens array, a fly's eye lens or a diffractive optical element.

In addition, according to a preferred embodiment of the sixth aspect of the invention, the diffractive optical device of the illumination field forming device is removed outside of the illumination optical system for normal circular illumination. In addition, it is preferable that the diffractive optical device of the illumination field forming device includes a first diffractive optical member that is rotatable about a first axis that is parallel to the optical axis, and a second diffractive optical member that is rotatable about a second axis that is parallel to the optical axis and positioned so as to be adjacent to the first diffractive optical member within a plane orthogonal to the optical axis. In this case, it is preferable that the first axis and the second axis have a positional relationship that is symmetrical about the optical axis within the orthogonal plane.

In addition, according to a preferred embodiment of the sixth aspect of the invention, the illumination optical system further includes a third diffractive optical member that is rotatable about a third axis that is parallel to the optical axis and positioned within the orthogonal plane so as to be adjacent to the first diffractive optical member or the second diffractive optical member, and a fourth diffractive optical member that is rotatable about a fourth axis that is parallel to the optical axis and positioned within the orthogonal plane so as to be adjacent to the third diffractive optical member, and adjacent to one of the second diffractive optical member and the first diffractive optical member. In this case, it is preferable that a rectangle formed by connecting the first axis, the second axis, the third axis and the fourth axis in the orthogonal plane forms a square centered about the optical axis.

Moreover, according to a preferred embodiment of the sixth aspect of the invention, the diffractive optical device of the illumination field forming device includes a first diffractive optical member that is rotatable about a predetermined axis that is parallel to an optical axis of the illumination optical system, and a second diffractive optical member that is rotatable about the predetermined axis. In addition, in the first diffractive optical member and the second diffractive optical member, at least a part of annular regions defined by a plurality of concentric circles are formed so as to be substantially the same. Furthermore, in the first diffractive optical member, diffraction surfaces are formed in odd-numbered regions from the center among the annular regions, and in the second diffractive optical member, diffraction surfaces are formed in even-numbered regions from the center among the annular regions. In this case, it is preferable that a radial dimension of the annular regions of the first and second diffractive optical members are substantially equal to each other. It also is preferable that the first diffractive optical member and the second diffractive optical member are positioned so as to be adjacent to each other along the predetermined axis. Moreover, it is preferable that the predetermined axis is coaxial with the optical axis of the illumination optical system.

In addition, according to a preferred embodiment of the second aspect of the invention, it also is preferable that entire surfaces of the first diffractive optical member and the second diffractive optical member include the annular regions defined by the plurality of concentric circles. It also is preferable that a part of surfaces of each of the first and second diffractive optical members includes the annular regions, and at least one of a diffraction surface and a refraction surface for converting the incident light beam into a predetermined light beam is formed at portions of the first and second diffractive optical members where the annular regions are not provided.

Furthermore, according to a preferred embodiment of the sixth aspect of the invention, the magnification changing optical system has a predetermined focal length, the optical member of the angular light beam forming device is positioned near an object plane of the magnification changing optical system, and the second predetermined surface is positioned on the exit pupil plane of the magnification changing optical system. In addition it is preferable that the optical integrator has a microlens array or a fly's eye lens. It also is preferable that the optical integrator has an internal reflection type rod integrator and a light collecting optical system that collects the light from the second predetermined surface near an incident end of the rod integrator.

Moreover, according to a preferred embodiment of the sixth aspect of the invention, the illumination field forming device is positioned in an optical path between a secondary light source forming surface on which the secondary light source is formed by the optical integrator, and a conjugate surface disposed closer to the light source side than the secondary light source forming surface among the surfaces optically conjugate with the secondary light source forming surface.

Furthermore, in order to accomplish the above-mentioned second object, according to a seventh aspect of the invention, an illumination optical system which illuminates a radiation-receiving plane includes a light source that supplies a light beam, and an angular light beam forming device that is provided with an optical member having a plurality of unit elements arranged two-dimensionally, and that converts the light beam supplied from the light source into a light beam having a predetermined dispersion angle with respect to an optical axis and makes that beam incident upon a first predetermined surface. The illumination optical system also includes an illumination field forming device that includes a refractive optical device which forms a predetermined illumination field on a second predetermined surface, based on the light beam having the predetermined dispersion angle which entered the first predetermined surface. The illumination optical system also includes an optical integrator which forms a secondary light source having a light intensity distribution which is substantially the same as the predetermined illumination field, based on the light beam from the predetermined illumination field formed on the second predetermined surface, and a magnification changing optical system which is arranged in an optical path between the illumination field forming device and the optical integrator. In the illumination optical system: the angular light beam forming device makes the predetermined dispersion angle continuously variable; the predetermined illumination field on the second predetermined surface includes at least one of four illumination fields centered about the optical axis, two illumination fields centered about the optical axis, and an annular illumination field; and the plurality of unit elements and the refractive optical device are arranged adjacent to each other.

In a preferred embodiment of the seventh aspect of the invention, the refractive optical device of the illumination field forming device is provided with a plurality of refractive surfaces arranged two-dimensionally. Additionally, the optical member of the angular light beam forming device is provided with a plurality of microlens arrays or a plurality of fly's eye lenses with a variable interval therebetween.

Furthermore, in order to accomplish the above-mentioned second object, according to an eighth aspect of the invention, an illumination optical system which illuminates a radiation-receiving plane includes a light source that supplies a light beam, and an angular light beam forming device which is provided with an optical member having a plurality of unit elements arranged two-dimensionally, and that converts the light beam supplied from the light source into a light beam having a predetermined dispersion angle with respect to an optical axis and makes that light beam incident upon a first predetermined surface. The illumination optical system also includes an illumination field forming device which includes a refractive optical device which forms a predetermined illumination field on a second predetermined surface, based on the light beam having the predetermined dispersion angle which entered the first predetermined surface. The illumination optical system also includes an optical integrator which forms a secondary light source having a light intensity distribution which is substantially the same as the predetermined illumination field, based on the light beam from the predetermined illumination field formed on the second predetermined surface. The illumination optical system also includes a magnification changing optical system which is arranged in an optical path between the illumination field forming device and the optical integrator. In the illumination optical system: the angular light beam forming device makes the predetermined dispersion angle variable; the predetermined illumination field on the second predetermined surface includes at least one of four illumination fields centered about the optical axis, two illumination fields centered about the optical axis, and an annular illumination field; the refractive optical device of the illumination field forming device is provided with a first refractive optical member which is rotatable about a first axis which is parallel to the optical axis, and a second refractive optical member which is rotatable about a second axis which is parallel to the optical axis and is arranged adjacent to the first refractive optical member within a plane orthogonal to the optical axis; and the plurality of unit elements and the refractive optical device are arranged adjacent to each other.

In this case, it is preferable that in the orthogonal plane, the first and second axes have a positional relationship which is substantially symmetrical with respect to the optical axis. In addition, according to a preferred embodiment of the eighth aspect of the invention, the illumination optical system further includes a third refractive optical member which is rotatable about a third axis which is parallel to the optical axis and is arranged adjacent to the first or second refractive optical members within the orthogonal plane; and a fourth refractive optical member which is rotatable about a fourth axis which is parallel to the optical axis and is arranged adjacent to the third refractive optical member within the orthogonal plane and adjacent to the second or first refractive optical members. In this case, it is preferable that in the orthogonal plane, a rectangle which connects the first, second, third, and fourth axes forms a square shape centered about the optical axis.

Furthermore, in order to accomplish the above-mentioned second object, according to a ninth aspect of the invention, an illumination optical system which illuminates a radiation-receiving plane includes a light source that supplies a light beam, and an angular light beam forming device which is provided with an optical member having a plurality of unit elements arranged two-dimensionally, and that converts the light beam supplied from the light source into a light beam having a predetermined dispersion angle with respect to an optical axis and makes the light beam incident upon a first predetermined surface. The illumination optical system also includes an illumination field forming device which includes a refractive optical device which forms a predetermined illumination field on a second predetermined surface, based on the light beam having the predetermined dispersion angle which entered the first predetermined surface. The illumination optical system also includes an optical integrator which forms a secondary light source having a light intensity distribution which is substantially the same as the predetermined illumination field, based on the light beam from the predetermined illumination field formed on the second predetermined surface. The illumination optical system also includes a magnification changing optical system which is arranged in an optical path between the illumination field forming device and the optical integrator. In the illumination optical system: the angular light beam forming device makes the predetermined dispersion angle variable; the predetermined illumination field on the second predetermined surface includes at least one of four illumination fields centered about the optical axis, two illumination fields centered about the optical axis, and an annular illumination field; the refractive optical device of the illumination field forming device is provided with a first refractive optical member which is rotatable about a predetermined axis which is parallel to the optical axis, and a second refractive optical member which is rotatable about the predetermined axis; in the first and second refractive optical members, at least part of annular regions defined by a plurality of concentric circles are formed so as to be substantially the same, and in the first refractive optical member, a refraction surface is formed in odd-numbered regions from the center among the annular regions, and in the second refractive optical member a refraction surface is formed in even-numbered regions from the center among the annular regions; and the plurality of unit elements and the refractive optical device are arranged adjacent to each other.

In this case, it is preferable that the radial dimension of the annular regions of the first and second refractive optical members are the same. Additionally, it is preferable that the first and second refractive optical members are arranged adjacent to each other along the predetermined axis. Furthermore, the predetermined axis preferably is coaxial with the optical axis of the illumination optical system.

In addition, in a preferred embodiment of the ninth aspect of the invention, in the first and second refractive optical members, the annular regions defined by the plurality of concentric circles are formed in substantially the same manner. Furthermore, in the first and second refractive optical members, part of the surfaces of each of the first and second refractive optical members includes the annular regions defined by the plurality of concentric circles, and at least one of a diffraction surface and a refraction surface which converts the entrance light beam into a predetermined light beam is provided at portions of the first and second refractive optical members where the annular regions are not located.

According to a tenth aspect of this invention, an exposure apparatus includes an illumination optical system of the fifth through ninth aspects of the invention; and a projection optical system which projects and exposes a pattern of a mask arranged at the radiation-receiving plane onto a photosensitive substrate.

An eleventh aspect of this invention relates to an exposure method in which a mask is illuminated via the illumination optical system of the fifth through ninth aspects of the invention, and an image of a pattern formed on the mask which was illuminated is projected and exposed onto a photosensitive substrate.

In the illumination optical system according to some aspects of this invention, a secondary light source having a quadrupole light intensity distribution is formed on an illumination pupil plane by using a diffractive (or refractive) optical device that converts an incident light beam into four light beams and forms a four-point (i.e., quadrupole) light beam centered about the optical axis on a far field. The diffractive optical device (or refractive optical device) according to one embodiment of the invention provides the first diffractive optical member (or refractive optical member) and the second diffractive optical member (or refractive optical member) that are rotatable about the first and second axes, respectively.

The first diffractive optical member (or refractive optical member) and the second diffractive optical member (or refractive optical member) may be positioned adjacent to each other within a plane orthogonal to the optical axis. In addition, within the orthogonal plane, the first axis and the second axis have a positional relationship that is symmetrical about the optical axis.

As a result, from the light beam incident to the diffractive (or refractive) optical device, a first pair of planar light sources is formed among the four planar light sources forming the quadrupole secondary light source based on the light beam incident to the first diffractive optical member (or refractive optical member), and a second pair of planar light sources is formed among the four planar light sources based on the light beam incident to the second diffractive optical member (or refractive optical member).

By rotating the first diffractive optical member (or refractive optical member) about the first axis, the angular position of the first pair of planar light sources can be continuously changed. In addition, by rotating the second diffractive optical member (or refractive optical member) about the second axis, the angular position of the second pair of planar light sources can be continuously changed. That is, by rotating the first diffractive optical member (or refractive optical member) and the second diffractive optical member (or refractive optical member), respectively, the angular position of each of the planar light sources forming the quadrupole secondary light source formed on the illumination pupil plane can be independently and continuously changed.

When applying the illumination optical system of some aspects of the invention to an exposure apparatus, generally there is a directionality on the mask pattern. Therefore, in this case, by independently and continuously changing the angular position of each of the planar light sources forming the quadrupole secondary light source formed on the illumination pupil plane based on the operation of the diffractive (or refractive) optical device, and by forming various quadrupole secondary light sources having two-time rotational symmetry (rotationally symmetrical about two axes) about the optical axis while maintaining predetermined angular relationships, illumination conditions which are different from each other in two directions orthogonally on the illuminated surface can be realized with a simple structure, and without an axicon system.

Furthermore, in the exposure apparatus to which the illumination optical system of some aspects of the invention is installed, and the exposure method using the illumination optical system by using an illumination optical system that can realize illumination conditions different from each other in the two orthogonal directions on the illuminated surface by forming various quadrupole secondary light sources having two-time rotational symmetry about the optical axis, the mask pattern can be faithfully transferred on the photosensitive substrate under an illumination condition that is optimal for the mask. Moreover, fine micro devices can be manufactured by using the exposure apparatus and exposure method of this invention, that can faithfully transfer the mask pattern onto the photosensitive substrate.

In addition, according to some aspects of this invention, the light beam from a light source is converted into a light beam having a predetermined dispersion angle with respect to the optical axis, and is incident to the first predetermined surface by an angular light beam forming device having an optical member having a plurality of unit elements arranged two-dimensionally. Then, using an illumination field forming device including diffractive optical devices and a magnification changing optical system, a predetermined illumination field is formed on the second predetermined surface based on the light beam having a predetermined dispersion angle that was incident to the first predetermined surface. In addition, a secondary light source having light intensity distribution substantially the same as the predetermined illumination field is formed by an optical integrator based on the light beam from the predetermined illumination field formed on the second predetermined surface. In this aspect of the invention, the angular light beam forming device is structured such that the predetermined dispersion angle can be varied, and the plurality of unit elements and the diffractive optical device are positioned adjacent to each other.

Therefore, according to one embodiment, using the illumination field forming device, diffractive optical devices for annular or quadrupole illumination, for example, are positioned in the illumination optical path. In addition, to obtain the annular or quadrupole secondary light source having a desired size (outer diameter) and/or shape (annular ratio) by the optical integrator, the dispersion angle for the angular light beam forming device is configured, and a focal length of the magnification changing optical system is set. As a result, based on the light beam from the light source, the annular or quadrupole secondary light source can be formed without a substantial loss of light amount.

Furthermore, by changing the dispersion angle by the angular light beam forming device or by changing the focal length of the magnification changing optical system as needed, the size and the annular ratio of the annular or quadrupole secondary light source formed by the optical integrator can be appropriately changed. As a result, various modified illuminations can be performed by appropriately changing the size and the annular ratio of the annular or quadrupole secondary light source without substantial loss of light amount in the formation and restriction of the formation of the annular or quadrupole secondary light sources.

In particular, the angular light beam forming device is structured from microlens arrays having variable gaps between the arrays, for example, and there is no optical system between the microlens arrays and the illumination field forming device (diffractive optical device). Therefore, using the angular light beam forming device and the illumination field forming device, the number of light transmissive members can be reduced and the illumination optical path can be shortened. As a result, as the entire illumination optical system, because the number of light transmissive members is reduced and the illumination optical path is shortened, the size of the space to be purged is reduced, and loss of light amount due to absorption of light in the illumination optical path is reduced.

As such, in the illumination optical system of some aspects of the invention, by making the illumination optical system compact based on the simple structure with few members and a short illumination optical path, the loss of light amount due to absorption of light in the illumination optical path can be reduced, and thus various modified illuminations, such as annular illumination and quadrupole illumination, can be performed.

Moreover, in the exposure apparatus to which the illumination optical system of aspects of the invention is installed, and in the exposure method using the illumination optical system, the mask pattern can be faithfully transferred to the photosensitive substrate under optimum illumination conditions for the mask by using the illumination optical system that can reduce the loss of light amount due to absorption of light in the illumination optical path and perform various modified illuminations, such as annular illumination and quadrupole illumination. Furthermore, excellent micro devices can be manufactured by using the exposure apparatus and the exposure method of this invention, which can faithfully transfer the mask pattern to the photosensitive substrate.

BRIEF DESCRIPTION OF THE DRAWINGS

The invention will be described in conjunction with the following drawings in which like reference numerals designate like elements and wherein:

FIG. 5A is a diagram schematically showing a structure of the diffractive optical device according to a second exemplary modification of the first embodiment and showing a structure of a first diffractive optical device 161a;

FIG. 9A is a diagram schematically showing an internal structure of a magnification changing optical system in the second embodiment, and indicating a long focal length state;

FIG. 9B is a diagram schematically showing an internal structure of a magnification changing optical system in the second embodiment, and indicating an intermediate focal length state;

FIG. 9C is a diagram schematically showing an internal structure of a magnification changing optical system in the second embodiment, and indicating a short focal length state;

FIG. 12A is a diagram explaining an operation of the angular light beam forming part of the second exemplary modification and showing a microlens array (or fly's eye lens) 222a;

FIG. 12B is a diagram explaining an operation of the angular light beam forming part of the second exemplary modification and showing a microlens array (or fly's eye lens) 222b;

FIG. 19A is a diagram schematically showing a structure of a diffractive optical device according an exemplary modification of the first and third embodiments, and is a diagram showing a structure of the first diffractive optical member 362a;

DETAILED DESCRIPTION OF PREFERRED EMBODIMENTS

Exemplary embodiments of this invention are described with reference to the attached drawings.

First Embodiment

Figure 1:
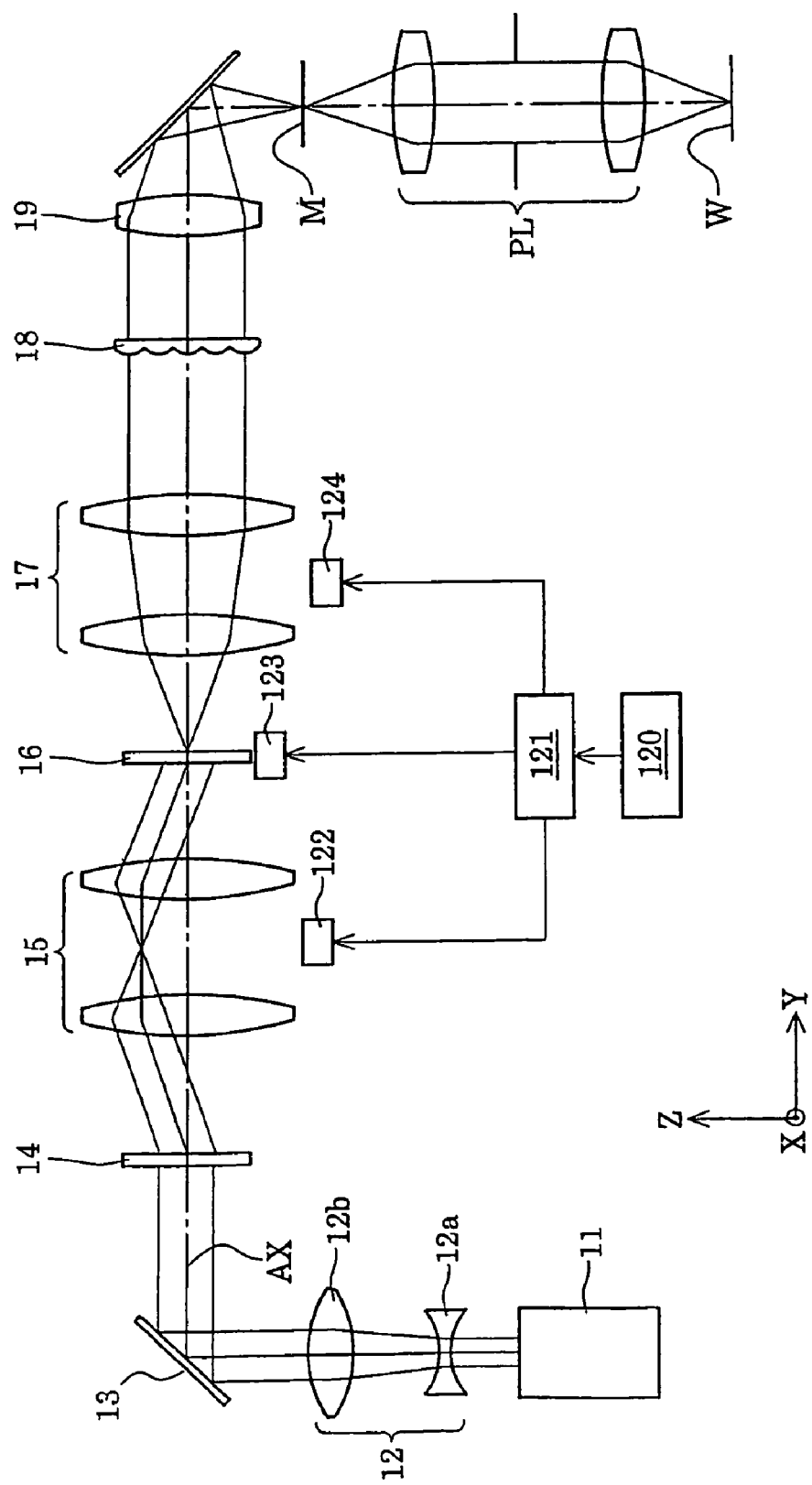
FIG. 1 is a diagram schematically showing a structure of an exposure apparatus that includes an illumination optical system according to a first exemplary embodiment of this invention.

FIG. 1 is a diagram schematically showing a structure of an exposure apparatus equipped with an illumination optical system according to a first exemplary embodiment of this invention. In FIG. 1, Z, Y and X axes are set respectively in the normal direction (Z axis) of a wafer, which is a photo-sensitive-material coated substrate, a direction parallel with the plane of the paper of FIG. 1 (Y axis) and within the wafer plane, and a direction perpendicular to the plane of paper of FIG. 1 (X axis) and within the wafer plane.

The exposure apparatus of FIG. 1 has an ArF excimer laser light source that supplies light having a wavelength of 193 nm, and functions as a light source 11 for supplying exposure light (illumination light). As the light source 11, a KrF excimer laser light source that supplies light having a wavelength of 248 nm, an $F_2$ laser light source that supplies light having a wavelength of 157 nm, a mercury lamp that supplies g-ray (436 nm) or i-ray (365 nm) may also be used. When using the mercury lamp, the light source 11 is structured to have a mercury lamp, an elliptical mirror, and a collimator lens.

Substantially parallel beams emitted from the light source 11 in the Z direction enter a beam expander 12 having a rectangular cross section in the XY plane and extending in the X direction and composed of a pair of lenses 12a and 12b. The lenses 12a and 12b have a negative refractive power and a positive refractive power, respectively, in the plane of the paper of FIG. 1 (in the YZ plane). Therefore, the light beam entering the beam expander 12 is expanded and shaped into light beams having a predetermined rectangular cross section.

The substantially parallel light beam that passed through the beam expander 12, which functions as a shaping optical system, enters a diffractive optical element 14 after being deflected in the Y direction by a deflecting (folding) mirror 13. For example, the diffractive optical element 14 is structured by forming steps on a glass substrate, the steps having a pitch of approximately the wavelength of the exposure light (illumination light), and functions to diffract the incident beam at a desired angle. The diffractive optical element 14 is a dispersion light beam forming element that functions to form a circular light beam in a far field by diffracting the incident rectangular parallel light beam.

Accordingly, the light beams diffracted through the diffractive optical element 14 enter an afocal zoom lens (magnification changing relay optical system) 15 and form circular light beams on the pupil plane. The light from the circular light beams exits the afocal zoom lens 15 and enters a diffractive optical device 16. The afocal zoom lens 15 is structured to: (1) be able to maintain the diffractive optical element 14 and the diffractive optical device 16 in an optically conjugate relationship, and (2) continuously change the magnification in a predetermined range while maintaining the afocal system (afocal optical system). The magnification amount of the afocal zoom lens 15 is changed by the first drive system 122 operated based on an instruction from a control system 121.

As a result, the light beams enter the diffractive optical device 16 from a diagonal (oblique) direction that is substantially symmetrical with respect to an optical axis AX. That is, the diffractive optical element 14 and the afocal zoom lens 15 function as an angular light beam forming device for converting the light beams from the light source 11 into light beams having various angular components with respect to the optical axis AX, and allows the light beams to enter an entrance surface (first predetermined surface) of the diffractive optical device 16. The diffractive optical device 16 functions as to convert the incident parallel light beams into four light beams that are centered about the optical axis AX at the far field, and such formation is performed by the second drive system 123 operating based on an instruction from the control system 121. Detailed structures and operations of the diffractive optical device 16 will be described later.

The light beam that passed through the diffractive optical device 16 illuminates a microlens array 18, that functions as an optical integrator, via zoom lens (magnification changing optical system) 17. The zoom lens 17 is a magnification changing optical system for varying σ values that can continuously change the focal length in a predetermined range, and maintains an optically conjugate relationship between the diffractive optical device 16 and the back focal plane of the microlens array 18. In other words, the zoom lens 17 connects the diffractive optical device 16 and the entrance surface of the microlens array 18 substantially in a Fourier transform relationship.

Therefore, the light beams that passed through the diffractive optical device 16 form a light intensity distribution based on convolution of a circle and four points, that is, a quadrupole illumination field composed of four circular illumination fields centered about the optical axis AX, on the back focal plane (and thus the entrance surface) of the microlens array 18. Thus, the diffractive optical device 16 and the zoom lens 17 function as an illumination field forming device for forming four illumination fields centered about the optical axis AX on the entrance surface (second predetermined surface) of the microlens array 18, based on the light beams having various angular components incident to the entrance surface (first predetermined surface) of the diffractive optical device 16. The overall size of this quadrupole illumination field changes depending on the focal length of the zoom lens 17. The change in the focal length of the zoom lens 17 is performed by the third drive system 124 based on an instruction from the control system 121.

The microlens array 18 is an optical element composed from many microlenses having positive refractive power arranged densely in length and width. Each of the microlenses structuring the microlens array 18 has a rectangular cross section similar to the shape of the illumination field to be formed on a mask M (and thus the shape of the exposure area to be formed on the wafer W). For example, the microlens array is composed by forming a microlens group by etching a planar, flat glass plate.

Each of the microlenses structuring the microlens array typically is smaller than each lens element structuring a fly's eye lens. In addition, the microlens array differs from the fly's eye lens, which is composed of lens elements that are separated from each other, because the many microlenses are formed integrally without being separated from each other. However, the microlens array is similar to a fly's eye lens in that lens elements having a positive refractive power are arranged in length and width. In FIG. 1, the number of microlenses structuring the microlens array 18 is shown to be much fewer than the actual number, to simplify the drawing.

Figure 2:
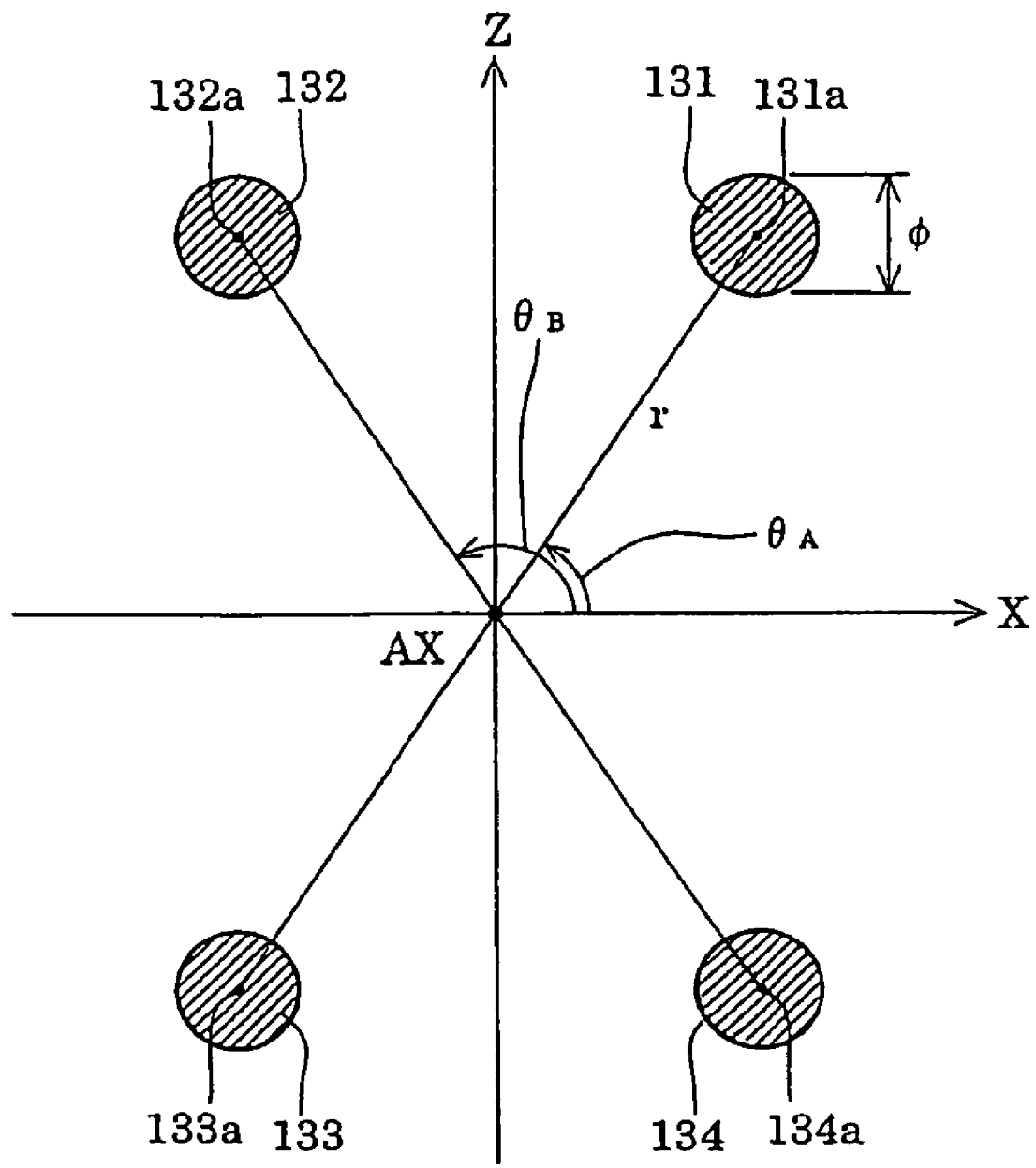
FIG. 2 is a diagram schematically showing a structure of quadrupole secondary light sources formed on the back focal plane of a microlens array.

Therefore, the light beam that entered the microlens array 18 is two-dimensionally separated by a plurality of microlenses, so that a plurality of light sources are formed on the back focal plane of each microlens. As a result, as shown in FIG. 2, secondary light sources are formed having the same light intensity distribution as the illumination field formed by the light beams entering the microlens array 18, that is, a quadrupole secondary light source formed from substantially planar light sources (shaded parts in the drawing) 131–134 composed of four circles centered about the optical axis AX. As such, the microlens array 18 functions as an optical integrator for forming a quadrupole light source having the same light intensity distribution as the four illumination fields, based on the light beams from the four illumination fields formed on the entrance surface (second predetermined surface) of the microlens array 18.

The light beams from the quadrupole light source formed on the back focal plane of the microlens array 18 are collected by a condenser optical system 19 after being restricted via an aperture diaphragm having quadrupole light transmissive parts as needed, and then superimposingly illuminate the mask M on which a predetermined pattern is formed. The light beam that passed the pattern on the mask M forms an image of the mask pattern onto the wafer W, which is a photosensitive substrate, through a projection optical system PL. As a result, the pattern of the mask M is sequentially exposed onto each exposure region on the wafer W by performing batch exposure or scanning exposure while driving and controlling the wafer W two-dimensionally in the plane (XY plane) orthogonal to the optical axis AX of the projection optical system PL.

In the batch exposure, the mask pattern is collectively exposed in each exposure region of the wafer in accordance with a so-called a step-and-repeat method. In this case, the shape of the illumination area on the mask M is a rectangle that is close to a square, and the cross-sectional shape of each microlens of the microlens array 18 also is a rectangle that is close to a square. On the other hand, in the scanning exposure, the mask pattern is scanning-exposed onto each exposure area of the wafer while mutually moving the mask and the wafer with respect to the projection optical system in accordance with a step-and-scan method. In this case, the shape of the illumination area on the mask M is a rectangle having a ratio of the short side to the long side of 1:3, for example, and the cross-sectional shape of each microlens of the microlens array 18 also is a similar rectangle.

In the first embodiment, a microlens array (or a fly's eye lens) may be used instead of the diffractive optical element 14. In this case, if a microlens array (or a fly's eye lens) that is composed of a hexagonal or square microlens (or lens element), a quadrupole secondary light source composed from four hexagonal or square planar light sources (instead of four circular light sources) is formed on the back focal plane of the microlens array 18.

Referring again to FIG. 2, the quadrupole light source formed on the back focal plane of the microlens array 18 is structured from four circular planar light sources 131–134. Centers 131*a*–134*a* of the respective planar light sources 131–134 are spaced from the optical axis AX by the same distance r, and each of the planar light sources 131–134 has a size (diameter) φ that is the same. The rectangle formed by connecting the four centers 131*a*–134*a* is a rectangle centered about the optical axis AX, and has sides parallel to the X and Z directions.

The distance r from the optical axis AX depends on the product of the focal length of the zoom lens 17 and the diffraction angle of the diffractive optical device 16. In addition, the size (diameter) φ depends on the product of the magnification of the afocal zoom lens 15, the focal length of the zoom lens 17, and the diffraction angle of the diffractive optical element 14 (dispersion angle if a microlens array or a fly's eye lens is used). Moreover, the angle $\theta_A$, which is formed between the +X axis and a line connecting the center 131a of the planar light source 131 with the optical axis AX, and the angle $\theta_B$, which is formed between the +X axis and a line connecting the center 132a of the planar light source 132 with the optical axis AX, depend on the diffraction characteristics of the diffractive optical device 16.

In the conventional art, the distance r of each planar light source from the optical axis AX and the size (diameter) φ of each planar light source can be continuously changed by changing the focal length of the zoom lens 17 and the magnification of afocal zoom lens 15. However, the angular positions $\theta_A$ and $\theta_B$ of each planar light source cannot be continuously changed. That is, the angular positions $\theta_A$ and $\theta_B$ of each planar light source can be discretely changed by changing the diffractive optical element, the microlens array, and the fly's eye lens to ones having different characteristics at the position of the diffractive optical device 16, but cannot be continuously changed.

Figure 3A:
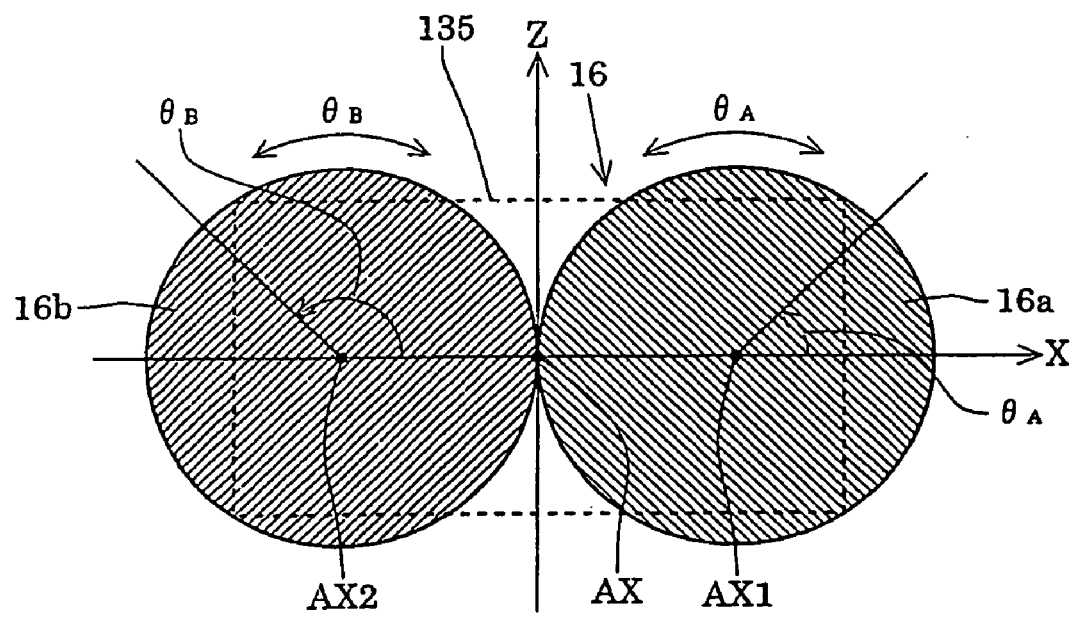
FIG. 3A is a front view schematically showing a structure of a diffractive optical device according to the first embodiment.
Figure 3B:
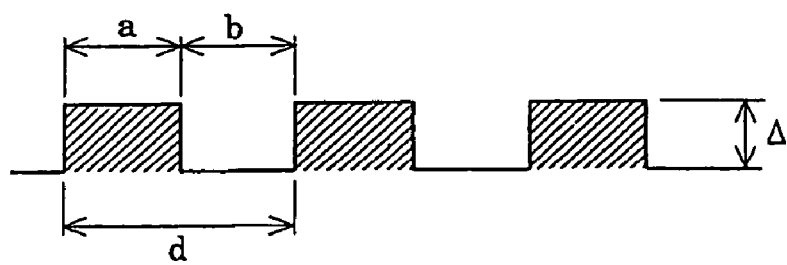
FIG. 3B is a diagram showing a cross-section of a diffractive optical device according to the first embodiment.

In the first embodiment, the diffractive optical device 16 is adapted so that it can continuously change the angular positions $\theta_A$ and $\theta_B$ of each planar light source that forms the quadrupole light source formed on the back focal point of the microlens array 18. FIG. 3A is a front view schematically showing the structure of the diffractive optical device according to the first embodiment. FIG. 3B is a diagram schematically showing the structure of the diffractive optical device of the first embodiment, and is a diagram showing a cross-section of the diffraction surface thereof Referring to FIG. 3A, the diffractive optical device 16 of the first embodiment is equipped with a first diffractive optical member 16a that is rotatable about a first axis AX1 which is parallel to the optical axis AX, and a second diffractive optical member 16b that is rotatable about a second axis AX2 which is parallel to the optical axis AX.

The first axis AX1 and the second axis AX2 are positioned on the X axis, and have a symmetrical relationship about the optical axis AX. The first diffractive optical member 16a and the second diffractive optical member 16b are positioned in a plane orthogonal to the optical axis AX (XZ plane), such that the first diffractive optical member 16a and the second diffractive optical member 16b are adjacent to each other along the X direction. Furthermore, the first diffractive optical member 16a and the second diffractive optical member 16b are disc shaped substrates having a similar structure, and have on a surface on one side, a diffraction surface formed in a shape shown in FIG. 3B.

In detail, a pitch d=λ/NA of the diffraction surface is set at 2.8 μm, for example, based on a numerical aperture NA, which corresponds to the diffraction angle determined by the first diffractive optical member 16a and the second diffractive optical member 16b (subsequently referred to as the numerical aperture corresponding to the diffraction angle determined by the diffractive optical device 16) and a wavelength λ of the exposure light (193 nm in the first embodiment). In this case, both a width a of the convex parts and a width b of the concave parts of the diffraction surface are set at 1.4 μm, for example. In addition, the step Δ=λ/{2(n−1)} is set at 172 nm, where the refractive index for the exposure light for the substrate formed by quartz (or fluorite), for example is defined by n. As can be seen from FIG. 3B, a=b=d/2.

As shown in FIG. 3A, a rectangular light beam 135, which is similar in shape to the light beam entering the diffractive optical element 14, enters the diffractive optical device 16. Then, the portion of the light beam that entered the first diffractive optical member 16a that is set such that the diffraction direction forms an angle $\theta_A$ with respect to the +X axis, forms a pair of planar light sources 131 and 133 that are symmetrical about the optical axis AX as shown in FIG. 2. On the other hand, the portion of the light beam that entered the second diffractive optical member 16b that is set such that the diffraction direction forms an angle $\theta_B$ with respect to the +X axis, forms a pair of planar light sources 132 and 134 that are symmetrical about the optical axis AX as shown in FIG. 2.

Therefore, in the diffractive optical device 16 of the first embodiment, the angular position $\theta_A$ of the planar light source 131 and the angular position ($\theta_A$+180 degrees) of the planar light source 133 can be continuously changed by rotating the first diffractive optical member 16a about the first axis AX1. Similarly, the angular position $\theta_B$ of the planar light source 132 and the angular position ($\theta_B$+180 degrees) of the planar light source 134 can be continuously changed by rotating the second diffractive optical member 16b about the second axis AX2. That is, by rotating each of the first diffractive optical member 16a and the second diffractive optical member 16b, the angular positions $\theta_A$ and $\theta_B$ of each planar light source forming the quadrupole secondary light source formed on the back focal plane of the microlens array 18 (i.e., illumination pupil plane) can be independently and continuously changed.

As described above, in an exposure apparatus, the mask pattern generally has directionality, and an illumination condition is generally set for each of two orthogonal directions on the mask. As such, in the first embodiment, the angular positions $\theta_A$ and $\theta_B$ of each planar light source forming the quadrupole secondary light source formed on the back focal plane of the microlens array 18 can be independently and continuously changed by the function of the diffractive optical device 16. Thus, various quadrupole secondary light sources having two-time rotational symmetry about the optical axis AX and maintain the relationship of $\theta_A+\theta_B=180$ degrees, so that illumination conditions that are different in the two orthogonal directions on the illuminated surface can be realized in accordance with a simple structure without using the axicon system.

Switching operation and the like for the illumination conditions in the first embodiment are described in detail below. First, information about each kind of mask to be sequentially scanned in accordance the step-and-repeat method or the step-and-scan method is input to the control system 121 via an input means 120, such as, for example, a keyboard. The control system 121 stores the information, such as the optimum line width (resolution) and the depth of focus of each of the masks in an internal memory, and supplies appropriate control signals to the drive systems 122–124 in response to the input from the input means 120.

That is, in order to obtain the quadrupole secondary light source having a desired form, the first drive system 122 sets the magnification of the afocal zoom lens 15 based on an instruction from the control system 121, the second drive system 123 sets rotation angles for each of the first diffractive optical member 16a and the second diffractive optical member 16b in the diffractive optical device 16 based on the instruction from the control system 121, and the third drive system 124 sets the focal length of the zoom lens 17 based on the instruction from the control system 121. By changing the magnification of the afocal zoom lens 15, the size φ of each planar light source can be changed without changing the distance r between each center of the four planar light sources and the optical axis AX.

Furthermore, by changing the focal length of the zoom lens 17, the quadrupole secondary light source can be enlarged or reduced by changing the distance r and the size φ. In addition, by changing the rotation angle of each of the first diffractive optical member 16a and the second diffractive optical member 16b, the angular positions $\theta_A$ and $\theta_B$ of each planar light source can be independently and continuously changed. As a result, the optimum illumination conditions can be realized in the two orthogonal directions on the illuminated surface by independently and continuously changing the angular positions $\theta_A$ and $\theta_B$ of each planar light source forming the quadrupole secondary light source, and by forming various quadrupole secondary light sources having two-time rotational symmetry about the optical axis AX while maintaining the relationship of $\theta_A + \theta_B = 180$ degrees.

In the first embodiment, as shown in FIG. 3A, a part of the rectangular light beam 135 entering the diffractive optical device 16 is lost in that it does not enter either the first diffractive optical member 16a or the second diffractive optical member 16b (i.e., it does not contribute to the illumination). In other words, a certain amount of light loss occurs at the diffractive optical device 16. In addition, in the first embodiment, because the first diffractive optical member 16a and the second diffractive optical member 16b are positioned along one direction, telecentricity of the light beam entering the microlens array 18 collapses, and uneven illumination occurs on the mask M due to the aberration of the microlens array 18. Thus, two exemplary modifications of the first embodiment, to be described, are possible for the diffractive optical device 16.

Figure 4:
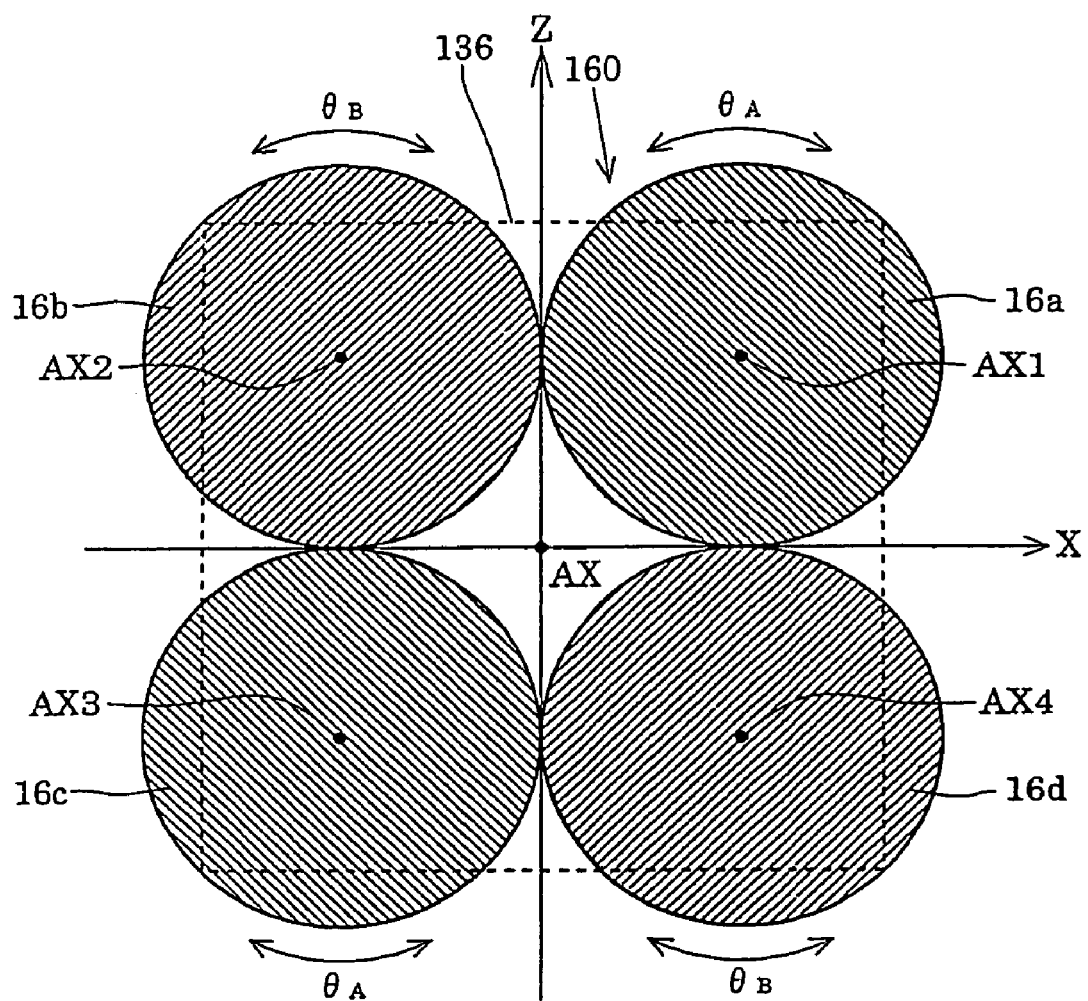
FIG. 4 is a diagram schematically showing a structure of a diffractive optical device according to a first exemplary modification of the first embodiment.

FIG. 4 is a diagram schematically showing a structure of a diffractive optical device according to a first exemplary modification of the first embodiment. As shown in FIG. 4, in the diffractive optical device 160 of the first exemplary modification, a third diffractive optical member 16c and a fourth diffractive optical member 16d are added to the diffractive optical device of the first embodiment. The third diffractive optical member 16c and the fourth diffractive optical member 16d have the same structure as the first diffractive optical member 16a and the second diffractive optical member 16b, and are rotatable about a third axis AX3 and a fourth axis AX4, respectively, which are parallel to the optical axis AX.

The first axis AX1 and the second axis AX2, and the third axis AX3 and the fourth axis AX4 are respectively positioned along the X direction, and a rectangle formed by connecting the first axis AX1, the second axis AX2, the third axis AX3, and the fourth axis AX4 is a square centered about the optical axis AX. That is, the third diffractive optical member 16c is positioned adjacent to the second diffractive optical member 16b in the Z direction; and the fourth diffractive optical member 16d is positioned adjacent to the third diffractive optical member 16c in the X direction, as well as being positioned adjacent to the first diffractive optical member 16a in the Z direction.

As shown in FIG. 4, a square light beam 136 that is similar in shape to the light beam entering the diffractive optical element 14, enters the diffractive optical device 160. The portions of the light beam that entered the first diffractive optical member 16a and the third diffractive optical member 16c, which are configured such that their diffraction direction has an angle $\theta_A$ about the +X axis, forms a pair of planar light sources 131 and 133 that are symmetrical about the optical axis AX shown in FIG. 2. On the other hand, the portions of the light beam that entered the second diffractive optical member 16b and the fourth diffractive optical member 16d, which are configured such that their diffraction direction has an angle $\theta_B$ about the +X axis, forms a pair of planar light sources 132 and 134 that are symmetrical about the optical axis AX shown in FIG. 2.

Therefore, in the diffractive optical device 160 according to the first exemplary modification, by rotating the first diffractive optical member 16a and the third diffractive optical member 16c about the first axis AX1 and the third axis AX3, respectively, so that the diffraction directions match each other, the angular position $\theta_A$ of the planar light source 131 and the angular position ($\theta_A + 180$ degrees) of the planar light source 133 can be continuously changed. Similarly, by rotating the second diffractive optical member 16b and the fourth diffractive optical member 16d about the second axis AX2 and the fourth axis AX4, respectively, so that the diffraction directions match each other, the angular position $\theta_B$ of the planar light source 132 and the angular position ($\theta_B + 180$ degrees) of the planar light source 134 can be continuously changed.

That is, by rotating the first diffractive optical member 16a through the fourth diffractive optical member 16d, respectively, the angular positions $\theta_A$ and $\theta_B$ of each planar light source forming the quadrupole secondary light source formed at the back focal plane of the microlens array 18 can be independently and continuously changed. In the first exemplary modification, although a certain amount of light loss occurs at the diffractive optical device 160, because the first diffractive optical member 16a through the fourth diffractive optical member 16d are positioned two-dimensionally along the two orthogonal directions, occurrence of unevenness of illumination on the mask M (and consequently the wafer W) can be prevented without substantially effecting the telecentricity of the light beam entering the microlens array 18.

Figure 5A:
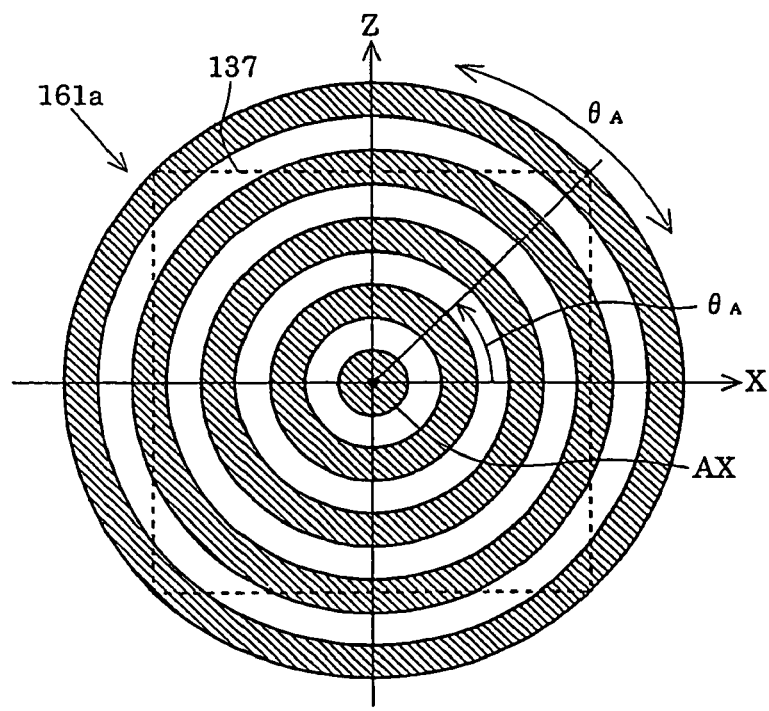
Figure 5B:
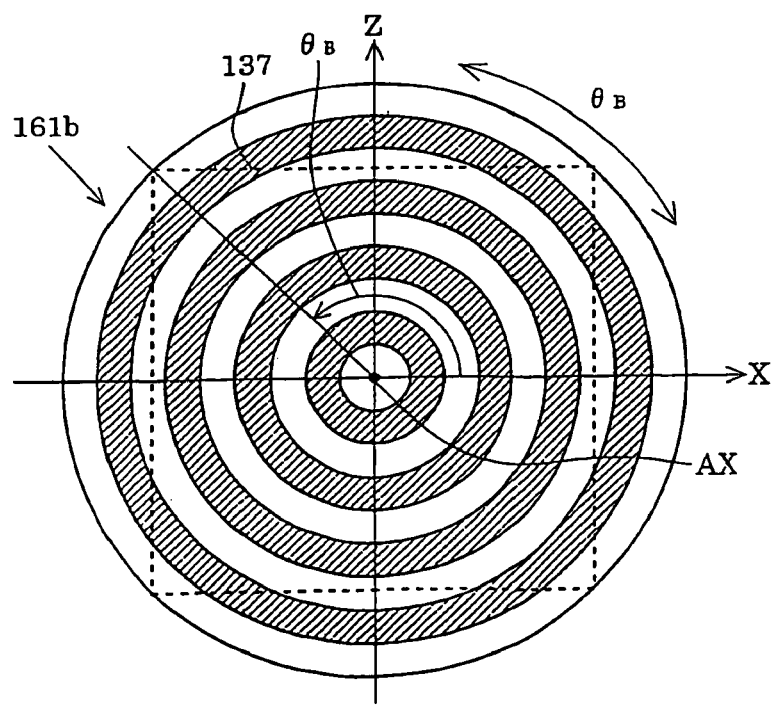
FIG. 5B is a diagram schematically showing a structure of the diffractive optical device according to the second exemplary modification of the first embodiment and showing a structure of a first diffractive optical device 161b.

FIG. 5A is a diagram schematically showing a structure of the diffractive optical device according to a second exemplary modification of the first embodiment, and is a diagram showing a structure of a modified first diffractive optical member 161a. FIG. 5B is a diagram schematically showing a structure of the diffractive optical device according to the second exemplary modification of the first embodiment, and is a diagram showing a structure of a modified second diffractive optical member 161b. As shown in FIG. 5A and FIG. 5B, the diffractive optical device 161 of the second exemplary embodiment is structured from the first diffractive optical member 161a that is rotatable about the optical axis AX, and the second diffractive optical member 161b that also is rotatable about the optical axis AX, and is positioned adjacent to the first diffractive optical member 161a along the optical axis AX. The first diffractive optical member 166a and the second diffractive optical member 166b are circular substrates having basically the same structure, and there is a plurality of circular, annular regions (9 regions in FIGS. 5A and 5B) provided concentrically on a surface on one side of the substrates.

Figure 6:
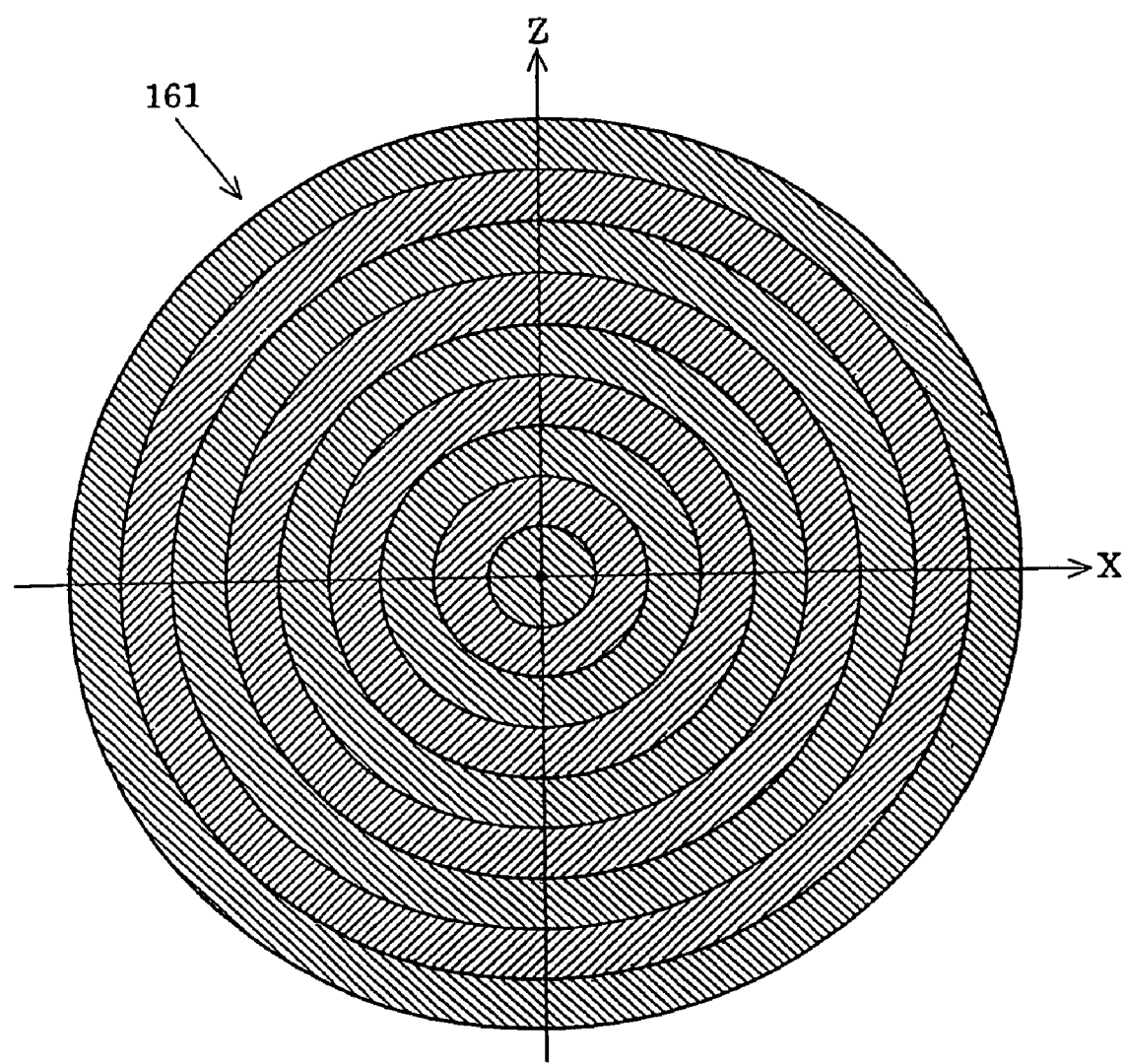
FIG. 6 is a diagram showing a form in which a first diffractive optical member and a second diffractive optical member are optically synthesized in the diffractive optical device according to the second exemplary modification.

The radial positions and the radial dimensions of the circular, annular regions of each member 161a and 161b are the same, with the radial dimension set approximately at L=0.5 mm, for example. However, in the first diffractive optical member 166a, the diffraction surface is formed in the odd-numbered regions from the center of the member. On the other hand, in the second diffractive optical member 161b, the diffraction surface is formed in the even-numbered regions from the center of the member. In the first diffractive optical member 166a and the second diffractive optical member 166b, the diffraction surfaces are formed having the same structure as the diffractive optical device 16 in the first embodiment. That is, the diffractive optical device 161 has a form that optically synthesizes the first diffractive optical member 166a and the second optical member 166b as shown in FIG. 6.

As shown in FIGS. 5A and 5B, a square light beam 137 that is similar to the light beam entering the diffractive optical element 14 enters the diffractive optical device 161, and consequently enters the first diffractive optical member 161a and the second diffractive optical member 161b. The light beam which entered the first diffractive optical member 161a, which is configured such that the diffraction direction has an angle $\theta_A$ about the +X axis, forms a pair of planar light sources 131 and 133 that are symmetrical about the optical axis AX shown in FIG. 2. On the other hand, the light beam which entered the second diffractive optical member 161b, which is configured such that the diffraction direction has an angle $\theta_B$ about the +X axis, forms a pair of planar light sources 132 and 134 that are symmetrical about the optical axis AX shown in FIG. 2.

Therefore, in the diffractive optical device 161 according to the second exemplary modification, by rotating the first diffractive optical member 161a about the axis AX, the angular position $\theta_A$ of the planar light source 131 and the angular position ($\theta_A$+180 degrees) of the planar light source 133 can be continuously changed. Similarly, by rotating the second diffractive optical member 166b about the optical axis AX, the angular position $\theta_B$ of the planar light source 132 and the angular position ($\theta_B$+180 degrees) of the planar light source 134 can be continuously changed. That is, by rotating the first diffractive optical member 166a and the second diffractive optical member 166b, respectively, the angular positions $\theta_A$ and $\theta_B$ of each planar light source forming the quadrupole secondary light source formed at the back focal plane of the microlens array 18 can be independently and continuously changed.

Except for the amount of light loss due to the diffraction operation, the second exemplary modification prevents a substantial amount of light from being lost due to the diffractive optical device 161, as shown in FIGS. 5A and 5B. In addition, because the diffraction surfaces in the first diffractive optical member 161a and the second diffractive optical member 166b are positioned concentrically (two-dimensionally), occurrence of unevenness of illumination on the mask M (and consequently the wafer W) can be prevented without substantially effecting the telecentricity of the light beam entering the microlens array 18.

In the second exemplary modification, it is desirable to substantially match the center axis of the first diffractive optical member 161a and the center axis of the second diffractive optical member 161b with the optical axis AX. In detail, it is preferable to keep the alignment error (centering error) of the first diffractive optical member 161a and the second diffractive optical member 161b smaller than L/20. In addition, it is more preferable to keep the alignment error (centering error) of the first diffractive optical member 161a and the second diffractive optical member 166b smaller than L/100. Moreover, to avoid loss of light amount in the diffractive optical device 161 as much as possible, it is preferable to maintain the gap along the optical axis AX between the diffraction surface of the first diffractive optical member 161a and the diffraction surface of the second diffractive optical member 166b smaller than (1/NA)×(L/20). In addition, it is more preferable to keep the gap smaller than (1/NA)×(L/100). Here, as described above, L is a radial dimension of the each of the circular, annular regions, and NA is a numerical aperture corresponding to the diffraction angle in the diffractive optical device 161.

In the above-described first embodiment and each exemplary modification, by independently and continuously changing the angular positions $\theta_A$ and $\theta_B$ of each planar light source forming the quadrupole secondary light source, various quadrupole secondary light sources can be formed that have two-time rotational symmetry about the optical axis AX while maintaining the relationship of $\theta_A+\theta_B=180$ degrees. However, it also is possible to form a dipole secondary light source formed from a pair of planar light sources displaced from each other in the Z direction by setting $\theta_B=\theta_A=90$ degrees. Furthermore, by setting $\theta_B=\theta_A=0$ degree (or 180 degrees), a dipole secondary light source composed of a pair of planar light sources in the X direction can be formed.

In addition, in the above-described first embodiment and each exemplary modification, a diffractive optical device that functions to form four-point light beams in the far field was explained. However, the diffractive optical device can be structured such that quadrupole light beams, in which each point has a certain degree of expansion, are formed in the far field. In such a case, a light intensity distribution based on a convolution of a circle and a quadrupole, that is a quadrupole illumination field centered about the optical axis AX, can be formed on the entrance plane of the microlens array 18. In the quadrupole secondary light source shown in the above FIG. 2, the shape of the four planar light sources 131–134 was circular, however, the shape of these planar light sources are not limited to a circular shape.

Second Embodiment

Figure 7:
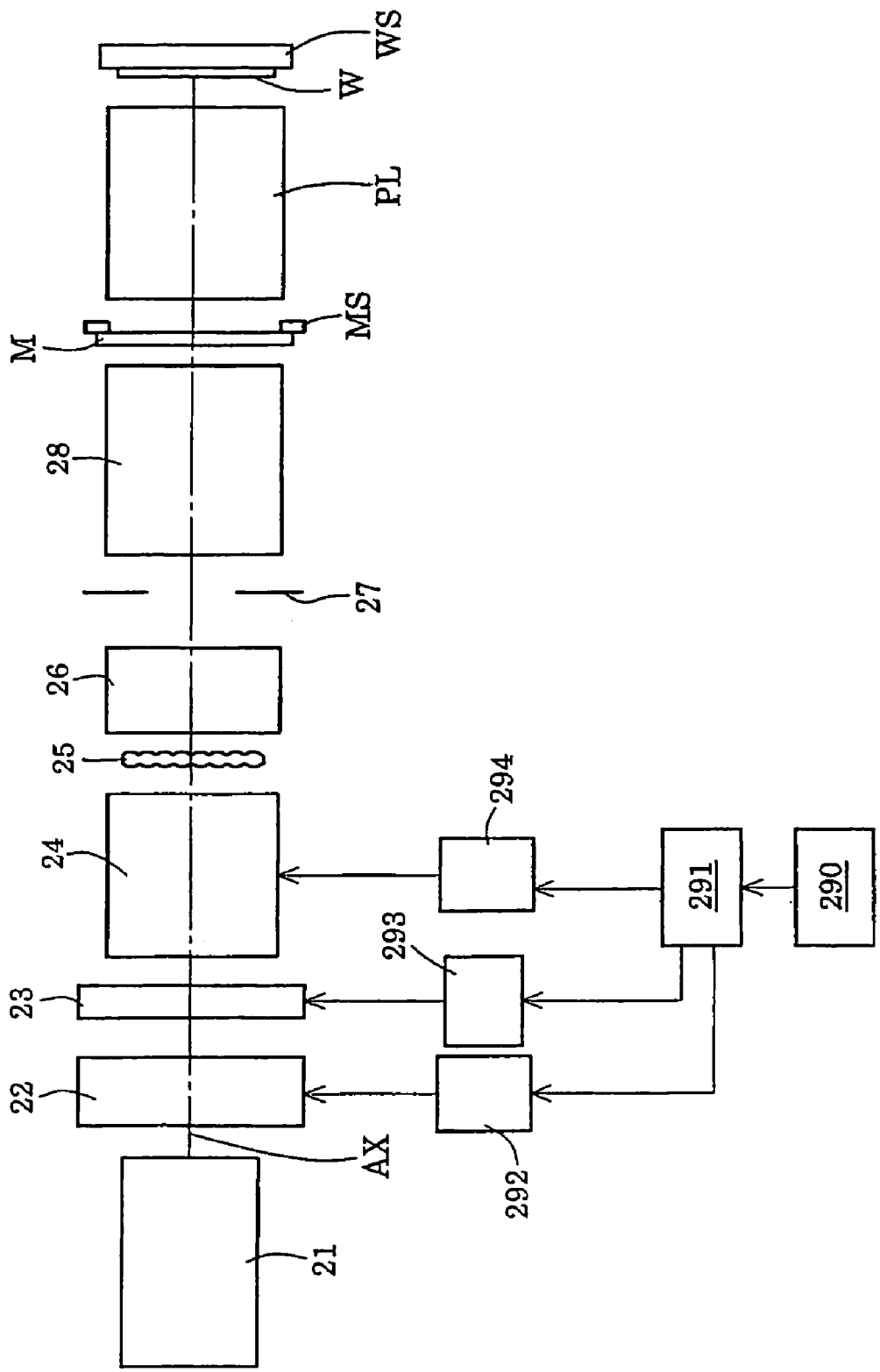
FIG. 7 is a diagram schematically showing a structure of an exposure apparatus that includes an illumination optical system according to the second embodiment of this invention.

FIG. 7 is a diagram schematically showing a structure of an exposure apparatus equipped with an illumination optical system according to a second exemplary embodiment of this invention. Referring to FIG. 7, the exposure apparatus of the second embodiment includes a light source 21 for supplying exposure light (illumination light). The light source 21 is structured from an ArF excimer laser light source that supplies light having a wavelength of 193 nm, for example, and a beam expander for adjusting the parallel beam emitted from the light source into a light beam having a predetermined rectangular cross-section.

In addition, a KrF excimer laser light source that supplies light having a wavelength of 248 nm or an $F_2$ laser light source that supplies light having a wavelength of 157 nm may be used as the light source. Moreover, a mercury lamp or a light source that supplies g-rays (436 nm) or i-rays (365 nm) may be used as the light source. When using the mercury lamp, the light source 21 typically is structured to have an elliptical mirror and a collimator lens. The parallel light beam supplied from the light source 21 along the optical axis AX enters an angular light beam forming part 22.

Figure 8A:
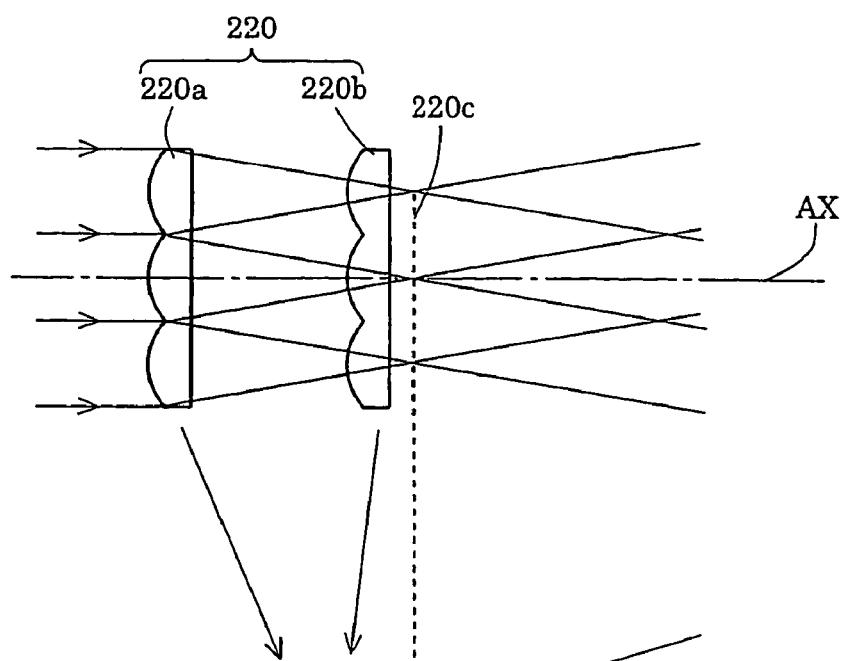
FIG. 8A is a diagram schematically showing an internal structure of an angular light beam forming part in the second embodiment, and indicating a long focal length state.
Figure 8B:
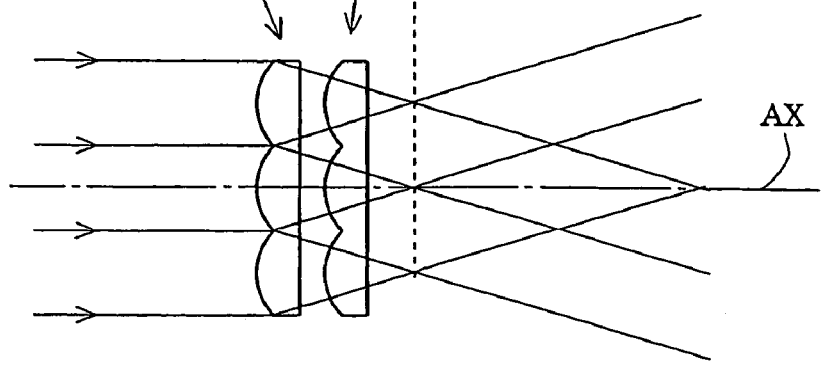
FIG. 8B is a diagram schematically showing an internal structure of an angular light beam forming part in the second embodiment, and indicating a short focal length state.

FIG. 8A is a diagram schematically showing an internal structure of the angular light beam forming part of the second embodiment, and indicates a long focal length state. FIG. 8B is a diagram schematically showing an internal structure of the angular light beam forming part of the second embodiment, and indicates a short focal length state. Referring to FIGS. 8A and 8B, the angular light beam forming part 22 has a microlens array group (or fly's eye lens group) 220 formed from a first microlens array (or first fly's eye lens) 220a formed by microlenses (or lens elements) having positive refractive power, and a second microlens array (or second fly's eye lens group) 220b formed by microlenses having positive refractive power. Each of the microlenses forming the microlens arrays 220a and 220b has a hexagon (or square) cross-section, and has the same size.

The microlens arrays are optical elements formed by a large number of microlenses having positive refractive power that are densely arranged in length and width. In general, the microlens arrays are structured by forming microlens groups by etching a planar, flat surface glass substrate. Each of the microlenses structuring the microlens arrays is smaller than each lens element structuring a fly's eye lenses. In addition, microlens arrays differ from fly's eye lenses in that the fly's eye lenses are isolated from each other, whereas a large number of microlenses are formed integrally without being isolated from each other. However, microlens arrays are similar to fly's eye lenses in that lens elements having positive refractive power are positioned in length and width. In FIGS. 8A and 8B, a very small number of microlenses structuring the microlens arrays are shown to simplify the drawings.

Each of the microlens arrays 220a and 220b is movable along the optical axis AX so that the back focal plane 220c of the microlens array group 220 does not substantially change. In other words, the gap between the first microlens array 220a and the second microlens array 220b is continuously variable, and the microlens array group 220 forms a wavefront split type optical integrator, which has a focal length that is continuously variable. The change in the focal length of the microlens array group 220 is performed by the first drive system 292 operated based on an instruction from a control system 291. In addition, when a small change in the focal plane 220c due to the change in space can be tolerated, because that change is small compared to the focal length of the magnification changing optical system (zoom lens), the focal length of the microlens array group 220 can be varied by moving only one of the first microlens array 220a and the second microlens array 220b.

The rectangular parallel light beam that entered the microlens array group 220 is two-dimensionally wavefront-split by the large number of microlenses, and a substantial planar light source having a rectangular shape (an entirely rectangular planar light source composed of many light sources) is formed at the back focal plane 220c thereof By changing the gap between the first microlens array 220a and the second microlens array 220b and thereby changing the focal length of the microlens array group 220, the dispersion angle of the light beam exited from the microlens array group 220 can be continuously changed.

An illumination field forming part 23 (more specifically, the entrance surface of the illumination field forming part 23) is position at the location of or near the back focal plane 220c of the microlens array group 220. The microlens array group 220 is an optical member having a plurality of unit elements arranged two-dimensionally, and functions as an angular light beam forming device that sends the light beam from the light source 21 into the entrance surface of the illumination field forming part 23 (first predetermined surface) by converting the light beam into a light beam having a predetermined dispersion angle with respect to the optical axis AX.

The illumination field forming part 23 has a plurality of diffractive optical elements (DOE) that are replaceably provided with respect to the illumination optical path. As this type of diffractive optical elements, diffractive elements for annular or quadrupole illumination as disclosed in Japanese Laid-Open Patent Application No. 2001-85293 (and corresponding European Laid-Open Patent Application No. 1014196), and diffractive optical elements for dipole illumination as disclosed in Japanese Laid-Open Patent Application No. 2002-25896, for example, may be used. The diffractive optical elements for annular illumination function to form an annular (toric shape without a width) light beam in the far field by diffracting the incident parallel light beam. In addition, the diffractive optical elements for quadrupole or dipole illumination function to form a 4-point or 2-point light beam in the far field by diffracting the incident parallel light beam.

As disclosed in the specification and drawings of Japanese Laid-Open Patent Application No. 2001-176766, diffractive optical elements for annular illumination that form a toric (annular) light beam having a width in the far field based on the incident parallel light beam, or diffractive optical elements for quadrupole illumination (or dipole illumination) that form a quadrupole (or dipole) light beam, in which each pole has a predetermined size, in the far field based on the incident parallel light beam, may be used in combination. Moreover, a plurality of diffractive optical elements for annular illumination that form an annular or toric light beam having mutually different shapes in the far field, or diffractive optical elements for quadrupole illumination (or dipole illumination) that form a 4-point (or 2-point) light beam or a quadrupole (or dipole) light beam in the far field, may be used in combination.

This plurality of diffractive optical elements are provided on a turret that is rotatable about an axis parallel to the optical axis AX, for example. On this turret, one circular opening (light transmissive part) also is provided for normal circular illumination. By using a plurality of diffractive optical elements that form annular or toric light beams having mutually different shapes or 4-point (or 2-point) or quadrupole (or dipole) light beams having mutually different shapes in combination, a variable range for the dispersion angle for the angular light beam forming part 22 can be narrowed.

As described above, the diffractive optical elements function as an illumination field forming device for forming the predetermined illumination field on the far field (second predetermined surface) based on the light beam having the predetermined dispersion angle that enters the entrance surface (first predetermined surface) thereof In addition, changing of the plurality of diffractive optical elements with respect to the illumination field optical path for the illumination forming part 23 is performed by the second drive system 293 that operates based on an instruction from the control system 291.

Referring to FIG. 7 again, the light beam that passed the diffractive optical elements of the illumination field forming part 23 illuminates a microlens array (or fly's eye lens) 25, which functions as an optical integrator, through a magnification changing optical system (zoom lens) 24. The magnification changing optical system 24 is a zoom lens for varying σ values that can continuously change the focal length within a predetermined range, and places the diffractive optical elements of the illumination field forming part 23 and the entrance surface of the microlens array 25 substantially in a Fourier transform relationship. In other words, the diffractive optical elements of the illumination field forming part 23 (and consequently the microlens array group 220) is positioned near the object plane of the magnification changing optical system 24, and the far field (second predetermined surface) of the diffractive optical elements is positioned in the exit pupil plane thereof FIG. 9A is a diagram schematically showing the internal structure of the magnification changing optical system in the second embodiment and indicates the long focal length state. FIG. 9B is a diagram schematically showing the internal structure of the magnification changing optical system in the second embodiment, and indicates an intermediate focal length state. FIG. 9C is a diagram schematically showing the internal structure of the magnification changing optical system in the second embodiment, and indicates the short focal length state. Referring to FIGS. 9A–9C, the magnification changing optical system 24 is structured by, from the light source side, a first lens group G1 having positive refractive power, a second lens group G2 having negative refractive power, a third lens group G3 having positive refractive power, and a fourth lens group G4 having positive refractive power. The first lens group G1 is fixed along the optical axis AX, but each of the second lens group G2 through the fourth lens group G4 moves along the optical axis AX, such that the back focal plane 24a of the magnification changing optical system 24 does not move substantially.

Thus, the light beam that passed though the diffractive optical elements of the illumination field forming part 23 forms an illumination field having a predetermined light intensity distribution at the back focal plane of the magnification changing optical system 24 (and consequently the entrance surface of the microlens array (or fly's eye lens) 25). In detail, when the diffractive optical elements for the annular illumination are provided in the illumination optical path using the illumination field forming part 23, the light intensity distribution based on the convolution of a hexagon and an annular or toric shape, that is an annular illumination field centered about the optical axis AX, is formed.

In addition, when the diffractive optical elements for quadrupole illumination are provided in the illumination optical path using the illumination field forming part 23, a quadrupole illumination field composed from a light intensity distribution based on the convolution of the hexagon (or square) and a 4-point or quadrupole shape, that is four illumination fields having a hexagon shape (or square shape) centered about the optical axis AX, is formed. Moreover, when the diffractive optical elements for dipole illumination are provided in the illumination optical path using the illumination field forming part 23, a dipole illumination field composed from a light intensity distribution based on the convolution of the hexagon (or square) and a 2-point or dipole shape, that is two illumination fields having a hexagon shape (or square shape) centered about the optical axis AX, is formed.

When an aperture for circular illumination is provided in the illumination optical path using the illumination field forming part 23, one illumination field of a hexagon shape (or square shape) centered about the optical axis, is formed. The entire size of these annular, quadrupole, dipole, and circular illumination fields can be varied continuously depending on the focal length of the magnification changing optical system 24. Changing the focal length of the magnification changing optical system 24, that is, by moving the second lens group G2 through the fourth lens group G4 along the optical axis AX in the magnification changing optical system 24, is performed by a third drive system 294 that operates based on an instruction of the control system 291.

The microlens array 25 is an optical element composed of many microlenses having positive refractive power that are densely arranged in length and width. Each microlens has a rectangular cross-section similar to the shape of the illumination field to be formed on the mask M (and consequently the shape of the exposure region to be formed on the wafer W). In FIG. 7, a very small number of microlenses forming the microlens array 25 is shown to simplify the drawing.

Therefore, the light beam that entered the microlens array 25 is two-dimensionally separated by the large number of microlenses, and a large number of light sources are formed on the back focal plane of each microlens. As a result, a secondary light source that has substantially the same light intensity distribution as the illumination field formed by the light beam entering the microlens array 25, is formed at the back focal plane of the microlens array 25. In detail, when diffractive optical elements for annular illumination are provided in the illumination optical path using the illumination field forming part 23, an annular secondary light source centered about the optical axis AX is formed.

Furthermore, when the diffractive optical elements for quadrupole illumination are provided in the illumination optical path using the illumination field forming part 23, a quadrupole secondary light source is formed that is composed from four substantially planar light sources of a hexagon shape (or square shape) centered about the optical axis AX. In addition, when the diffractive optical elements for dipole illumination are provided in the illumination optical path using the illumination field forming part 23, a dipole secondary light source is formed that is composed from two substantially planar light sources of a hexagon shape (or square shape) centered about the optical axis AX. Moreover, when the diffractive optical elements for circular illumination are provided in the illumination optical path using the illumination field forming part 23, one secondary light source of a hexagon shape (or square shape) centered about the optical axis AX is formed.

As described above, the microlens array 25 forms an optical integrator for forming a secondary light source having a light intensity distribution substantially the same as the illumination field, based on the light beam from the illumination field formed on the entrance surface (second predetermined surface) of the microlens array 25. The light beams from the secondary light source formed on the back focal plane of the microlens array 25 superimposingly illuminate a mask blind 27 operating as an illumination field diaphragm, after being limited though an aperture diaphragm (not shown in the figure) having a light transmissive part with a predetermined shape, and after being collected by a condenser optical system 26. The light beam transmitted though a rectangular opening (light transmissive part) of the mask blind 27 superimposingly illuminates the mask M after being collected by an image forming optical system 28.

The mask is supported on a two-dimensionally movable mask stage MS. The light beam transmitted though a pattern of the mask M forms an image of the mask pattern on the wafer W, which is a photosensitive substrate, through the projection optical system PL. The wafer W is supported on a two-dimensionally movable wafer stage WS. The pattern of the mask M is sequentially exposed in each exposure (shot) region of the wafer W by performing batch exposure or scanning exposure while two-dimensionally driving and controlling the wafer in the plane (XY plane) orthogonal to the optical axis AX of the projection optical system PL.

Making the cross-sectional shape of each microlens of the microlens array 25 of a rectangular shape close to a square by matching it to the illumination region of a rectangular shape close to a square on the mask M during the batch exposure, or making the cross-sectional shape of each microlens of the microlens array 25 of a rectangular shape by matching it to the illumination region of a rectangular shape on the mask M during the scanning exposure may be similar to that in the above-described first embodiment.

A switching operation of the illumination in the second embodiment is described in detail below. First, information and the like related to each kind of mask to be serially exposed in accordance with the step-and-repeat method or the step-and-scan method are input into the control system 291 via an input part 290, such as a keyboard. The control system 291 stores in an internal memory the information, such as an optimum width (resolution), depth of focus and the like related to each mask, and provides appropriate control signals to the first drive system 292 through the third drive system 294 in response to the input from the input part 290.

That is, in case of the annular illumination under the optimum resolution and depth of focus, the second drive system 293 positions the diffractive optical elements for annular illumination in the illumination optical path using the illumination field forming part 23, by rotating the turret based on the instruction from the control system 291. Then, in order to make the annular secondary light source have the desired size (outer diameter) and shape (annular ratio) on the back focal plane of the microlens array 25, the first drive system 292 sets the focal length of the microlens array group 220 using the angular light beam forming part 22 based on the instruction from the control system 291, and the third drive system 294 sets the focal length of the magnification changing optical system 24 based on the instruction from the control system 291. As a result, the annular secondary light source is formed without substantial loss of light amount (illumination intensity) based on the light beam supplied from the light source 21.

Moreover, as desired, the size and annular ratio of the annular secondary light source formed on the back focal plane of the microlens array 25 may be appropriately changed by changing the focal length of the microlens array group 220 by the first drive system 292, changing the focal length of the magnification changing optical system 24 by the third drive system 294, or switching the diffractive optical elements with a different group of diffractive optical elements for annular illumination having a different shape by the second drive system 293. As a result, various annular illuminations can be achieved by appropriately changing the size and annular ratio of the annular secondary light source, without substantially losing the light amount for forming the annular secondary light source.

Furthermore, for quadrupole illumination (or dipole illumination) under the optimum resolution and depth of focus, the second drive system 293 positions the diffractive optical elements for the quadrupole illumination (or dipole illumination) in the illumination optical path using the illumination field forming part 23 by rotating the turret based on the instruction from the control system 291. Then, in order to obtain the quadrupole (or dipole) secondary light source having the desired size (outer diameter) and shape (annular ratio) on the back focal plane of the microlens array 25, the first drive system 292 sets the focal length of the microlens array group 220 using the angular light beam forming part 22 based on the instruction from the control system 291, and the third drive system 294 sets the focal length of the magnification changing optical system 24 based on the instruction from the control system 291. As a result, the quadrupole (or dipole) secondary light source can be formed without substantial loss of light amount, based on the light beam supplied from the light source 21.

Moreover, as desired, the size and annular ratio of the quadrupole (or dipole) secondary light source formed on the back focal plane of the microlens array 25 may be appropriately changed by changing the focal length of the microlens array group 220 by the first drive system 292, changing the focal length of the magnification changing optical system 24 by the third drive system 294, or switching the diffractive optical elements with a different group of diffractive optical elements for quadrupole illumination (or dipole illumination) having a different shape by the second drive system 293. As a result, various quadrupole illuminations (or dipole illuminations) can be achieved by appropriately changing the size and annular ratio of the quadrupole (or dipole) secondary light source, without substantially losing the light amount for forming the quadrupole (or dipole) secondary light source.

Furthermore, for circular illumination under the optimum resolution and depth of focus, the second drive system 293 removes the diffractive optical elements from the illumination optical path and positions an aperture for circular illumination in the illumination optical path using the illumination field forming part 23 by rotating the turret based on the instruction from the control system 291. Then, in order to obtain the hexagonal (or square) secondary light source having the desired size (outer diameter) on the back focal plane of the microlens array 25, the first drive system 292 sets the focal length of the microlens array group 220 using the angular light beam forming part 22 based on the instruction from the control system 291, and the third drive system 294 sets the focal length of the magnification changing optical system 24 based on the instruction from the control system 291. The hexagonal (or square) secondary light source formed on the back focal plane of the microlens array 25 is limited by a circular aperture diaphragm, such as an iris diaphragm, as needed.

As a result, a circular secondary light source can be formed without substantial loss of light amount, based on the light beam supplied from the light source 21. In addition, as desired, the size and annular ratio of the hexagonal (or square) secondary light source formed on the back focal plane of the microlens array 25 may be appropriately changed by changing the focal length of the microlens array group 220 by the first drive system 292, changing the focal length of the magnification changing optical system 24 by the third drive system 294, or switching the diffractive optical elements with a different group of diffractive optical elements for circular illumination having a different shape by the second drive system 293. As a result, various circular illuminations can be achieved by appropriately changing the σ values, without substantially losing the light amount for forming the circular secondary light source.

In the above explanation of operations, the angular light beam forming part 22, the illumination field forming part 23 and the magnification changing optical system 24 are controlled based on the mask pattern information supplied from the input part 290. However, the invention is not limited to this manner of control, but the illumination field forming part 23 and the magnification changing optical system 24 also can be controlled based on reading results (mask pattern information) supplied by a barcode reader of a barcode provided for the mask, and which can be read, for example, during the transportation of the mask.

As described above, in the second embodiment, modified illumination, such as annular illumination, quadrupole illumination and dipole illumination, and normal circular illumination can be performed while limiting the loss of light amount. In addition, by a simple control, that is, changing the focal length of the microlens array group 220 and the magnification changing optical system 24, parameters for the modified illumination and the normal circular illumination can be changed while limiting the loss of light amount, and thus, various modified illuminations, such as annular illuminations, quadrupole illuminations, and dipole illuminations, and various circular illuminations can be performed.

Furthermore, because no optical system exists between the microlens array group 22 of the angular light beam forming part 22 and the illumination field forming part 23, the number of light transmissive members are extremely small, and the illumination optical path is extremely short, in the angular light beam forming part 22 and the illumination field forming part 23. As a result, for the illumination optical system as a whole, because the number of light transmissive members is small and the illumination optical path is short, the space to be purged becomes small, and the loss of light amount due to light absorption in the illumination optical path can be reduced or avoided well. As a result, in the second embodiment, by achieving the compactness of the illumination optical system in accordance with a simple structure with a fewer number of members and a shorter illumination optical path, the loss of light amount due to light absorption in the illumination optical path can be reduced, and various modified illuminations, such as annular illuminations, quadrupole illuminations and dipole illuminations, and various normal illuminations, can be performed.

In the above-described second embodiment, the microlens array group 220 that is formed from the first microlens array 220a composed from microlenses having positive refractive power, and the second microlens array 220b composed from microlenses having positive refractive power, is used. However, various exemplary modifications are possible for the structure of the angular light beam forming part 22.

Figure 10A:
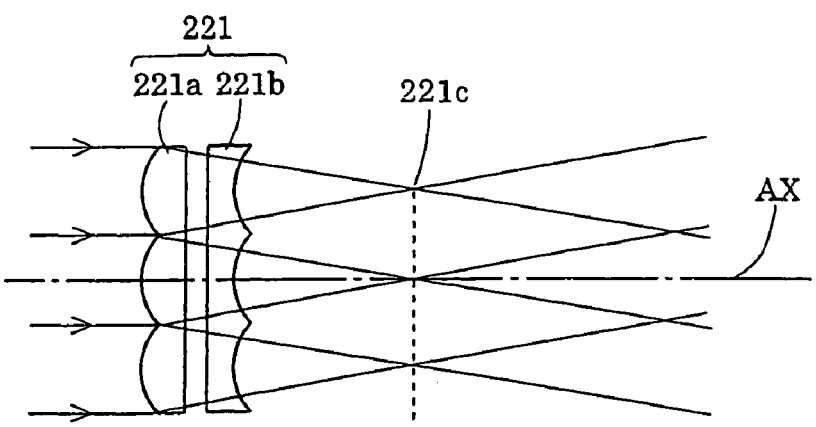
FIG. 10A is a diagram schematically showing the first exemplary modification of the angular light beam forming part, and indicating a long focal length state.
Figure 10B:
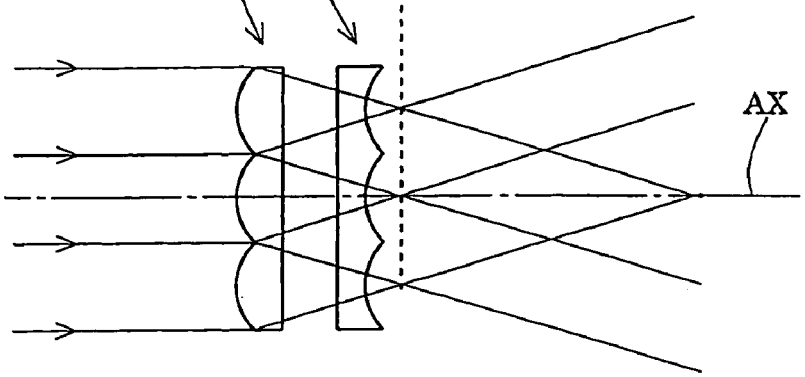
FIG. 10B is a diagram schematically showing the first exemplary modification of the angular light beam forming part, and indicating a short focal length state.

FIG. 10A is a diagram schematically showing a first exemplary modification of the angular light beam forming part, and indicates a long focal length state. FIG. 10B is a diagram schematically showing the first exemplary modification of the angular light beam forming part, and indicates a short focal length state. Referring to FIGS. 10A and 10B, a microlens array group (or fly's eye lens group) 221 is used that is formed from a first microlens array (or first fly's eye lens) 221a composed from microlenses having positive refractive power, and a second microlens array (or second fly's eye lens) composed of microlenses having negative refractive power. The microlens arrays 226a and 226b are movable along the optical axis AX, respectively, such that the back focal plane 221c of the microlens array group 221 does not substantially change.

As described above in the second embodiment, both the first microlens array and the second microlens array are composed of microlenses having positive refractive power. However, in the first exemplary modification, either one of the microlens arrays can be composed of microlenses having negative refractive power. In addition, in the above-described second embodiment and the first exemplary modification, the microlens array group is structured from two microlens arrays. However, the microlens array group having a focal length that is variable may be structured from three or more microlens arrays.

Figure 11:
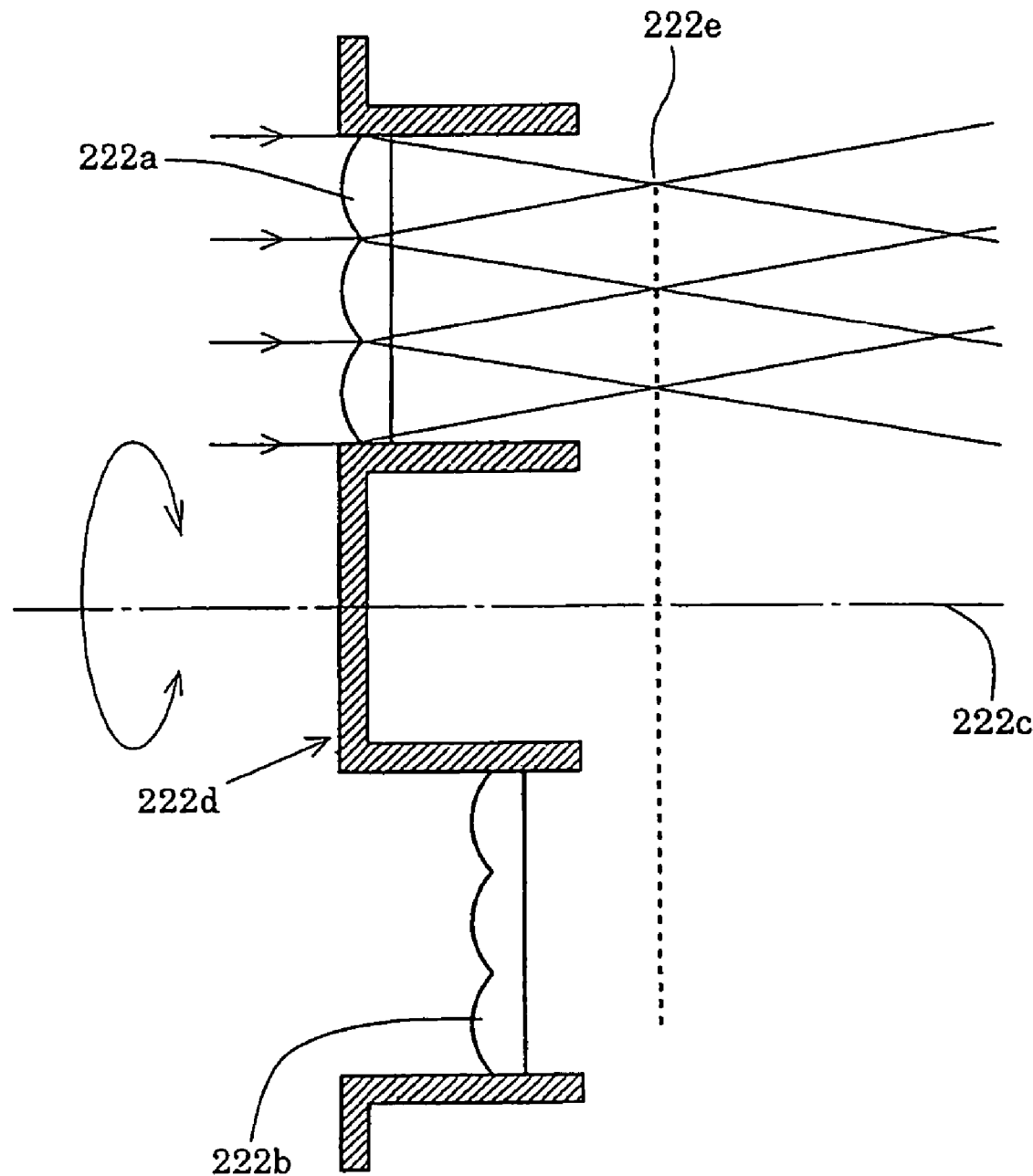
FIG. 11 is a diagram schematically showing the second exemplary modification of the angular light beam forming part.
Figure 12:
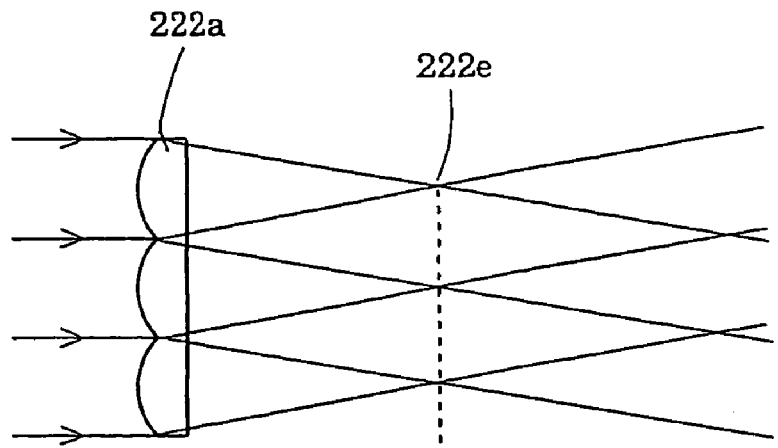
Figure 12:
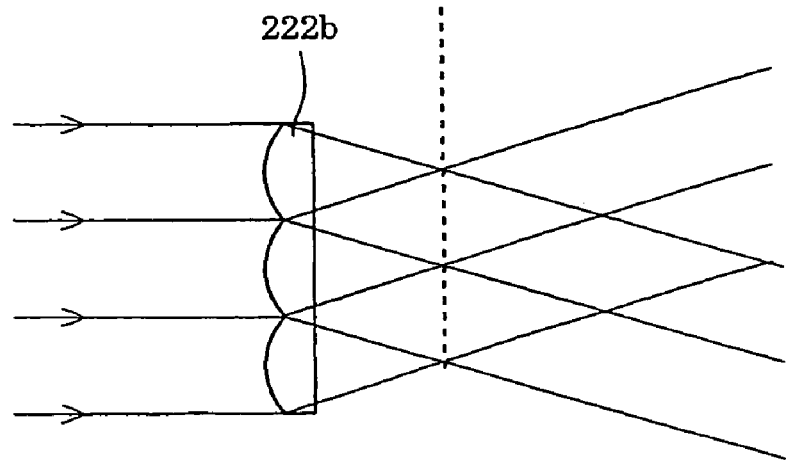

FIG. 11 is a diagram schematically showing a second exemplary modification of the angular light beam forming part. FIG. 12A is a diagram explaining the operation of the angular light beam forming part of the second exemplary modification, and shows a microlens array (or fly's eye lens) 222a. FIG. 12B is a diagram explaining the operation of the angular light beam forming part of the second exemplary modification, and shows a microlens array (or fly's eye lens) 222b. Referring FIGS. 11, 12A and 12B, in the second exemplary modification, the microlens array (or fly's eye lens) 222a and the microlens array (or fly's eye lens) 222b, which have focal lengths that differ from each other, are mounted on a turret 222d that is rotatable about a rotation axis 222c parallel with the optical axis AX. The first microlens array 222a and the second microlens array 222b are mounted at a position different from each other along the optical axis AX, such that the back focal plane of the first microlens array 222a and the back focal plane of the second microlens array 222b substantially match the plane indicated by a dotted line 222e in the drawings.

In the above-described second embodiment and the first exemplary modification, the change in the dispersion angles by the angular light beam forming part 22 is continuous. However, in the second exemplary modification, the change in the dispersion angles by the angular light beam forming part 22 is discrete. In the second exemplary modification, two microlens arrays which have different focal lengths are mounted on the turret. However, the number of the microlens arrays is not limited to two, but three or more microlens arrays (or fly's eye lenses) having different focal lengths may be mounted on the turret.

Figure 13:
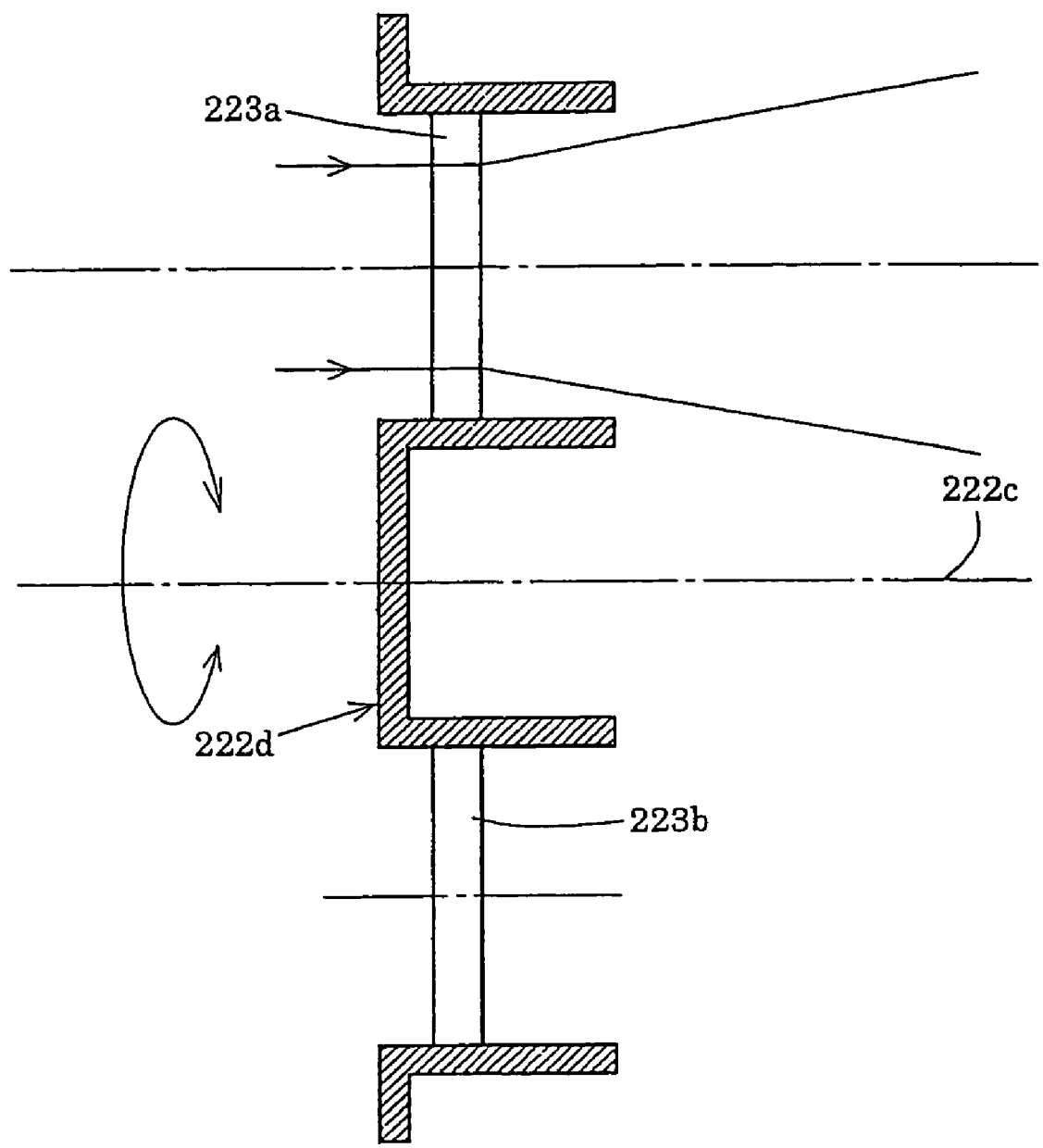
FIG. 13 is a diagram schematically showing the third exemplary modification of the angular light beam forming part.
Figure 14A:
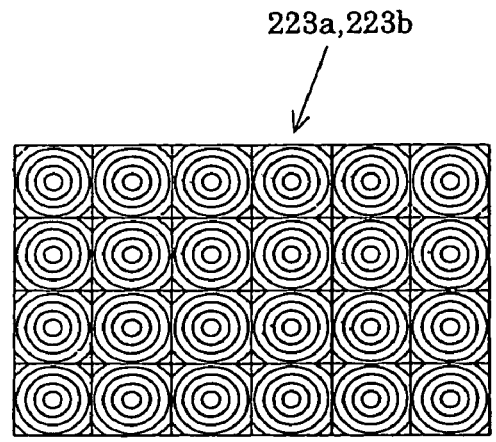
FIG. 14A is a diagram explaining the structure and operation of the angular light beam forming part of the third exemplary modification and is a plan view of each diffractive optical element.
Figure 14B:
FIG. 14B is a diagram explaining the structure and operation of the angular light beam forming part of the third exemplary modification and is a cross-section of a unit element forming each diffractive optical element.
Figure 14C:
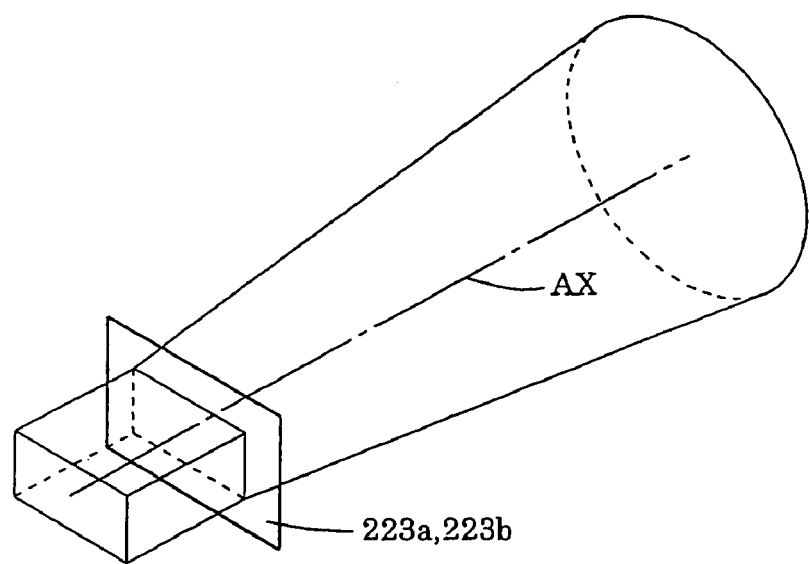
FIG. 14C is a diagram explaining the structure and operation of the angular light beam forming part of the third exemplary modification and explaining functions of each diffractive optical element.

FIG. 13 is a diagram schematically showing a third exemplary modification of the angular light beam forming part. FIG. 14A is a diagram explaining the structure and operation of the angular light beam forming part of the third exemplary modification, and shows a plan view of each diffractive optical element. FIG. 14B is a diagram explaining the structure and operation of the angular light beam forming part of the third exemplary modification, and shows a cross-section of a unit element structuring each diffractive optical element. FIG. 14C is a diagram explaining the structure and operation of the angular light beam forming part of the third exemplary modification, and explains the function of each diffractive optical element. Referring to FIG. 13, diffractive optical elements 223a and 223b having dispersion angles (diffraction angles) that differ from each other are mounted on a turret 222d that is rotatable about a rotation axis 222c parallel with the optical axis AX.

Each of the diffractive optical elements 223a and 223b is an optical member having a plurality of unit elements arranged in a two-dimensional matrix, as shown in FIG. 14A. Each unit element has a cross section that forms an annular diffraction surface as shown in FIG. 14B. As shown in FIG. 14C, each of the diffractive optical elements 223a and 223b functions to form a circular light beam in the far field by diffracting the rectangular parallel beam that enters it along the optical axis AX. In other words, the function of each unit element is the same as a positive lens or a negative lens.

In the third exemplary modification, each unit element is structured as a two-step phase-type diffractive element, but they also may be an oscillation-type diffractive element, and the number of steps (levels) of the element may be four or eight instead of two. Moreover, each unit element may be structured as a Fresnel lens (brazed (having a sawtooth cross section) diffractive element). The third exemplary modification changes the dispersion angles by the angular light beam forming part, similarly to the second exemplary modification. In addition, in the third exemplary modification, two diffractive optical elements having different dispersion angles from each other are mounted on the turret, but the number of diffractive optical elements is not limited to two, and three or more than three diffractive optical elements may be mounted on the turret.

Figure 15A:
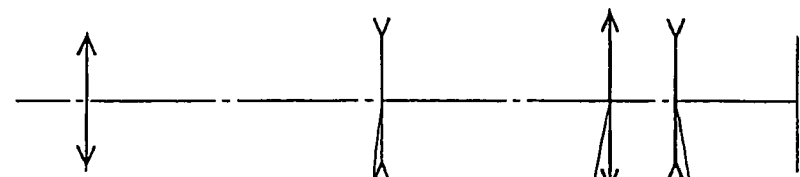
FIG. 15A is a diagram schematically showing the first modification of the magnification changing optical system, and indicating a long focal length state.
Figure 15B:
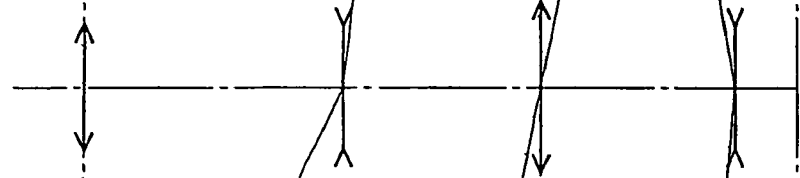
FIG. 15B is a diagram schematically showing the first modification of the magnification changing optical system, and indicating an intermediate focal length state.
Figure 15C:
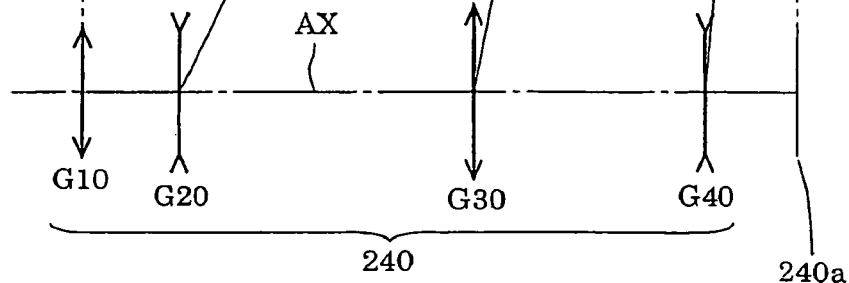
FIG. 15C is a diagram schematically showing the first modification of the magnification changing optical system, and indicating a short focal length state.

Furthermore, in the above-described second embodiment, the magnification changing optical system 24 has, from the light source side, lenses with positive, negative, positive and positive diffractive powers. However, there are various possible modifications for the structure of the magnification changing optical system. FIG. 15A is a diagram schematically showing a first exemplary modification of the magnification changing optical system and indicates a long focal length state. FIG. 15B is a diagram schematically showing the first exemplary modification of the magnification changing optical system and indicates an intermediate focal length state. FIG. 15C is a diagram schematically showing the first exemplary modification of the magnification changing optical system and indicates a short focal length state. Referring to FIGS. 15A–15C, the magnification changing optical system 240 of the first exemplary modification is structured from, from the light source side (left side of the drawings), a first lens group G10 having positive refractive power, a second lens group G20 having negative refractive power, a third lens group G30 having positive refractive power, and a fourth lens group G40 having negative refractive power.

The first lens group G10 is fixed along the optical axis AX. However, each of the second lens group G20 through the fourth lens group G40 moves along the optical axis AX, such that the back focal plane 240a of the magnification changing optical system 240 does not substantially change. In the magnification changing optical system 240 of the first exemplary modification, the focal length can be continuously changed, similar to the magnification changing optical system 24 of the above-described second embodiment.

Figure 16:
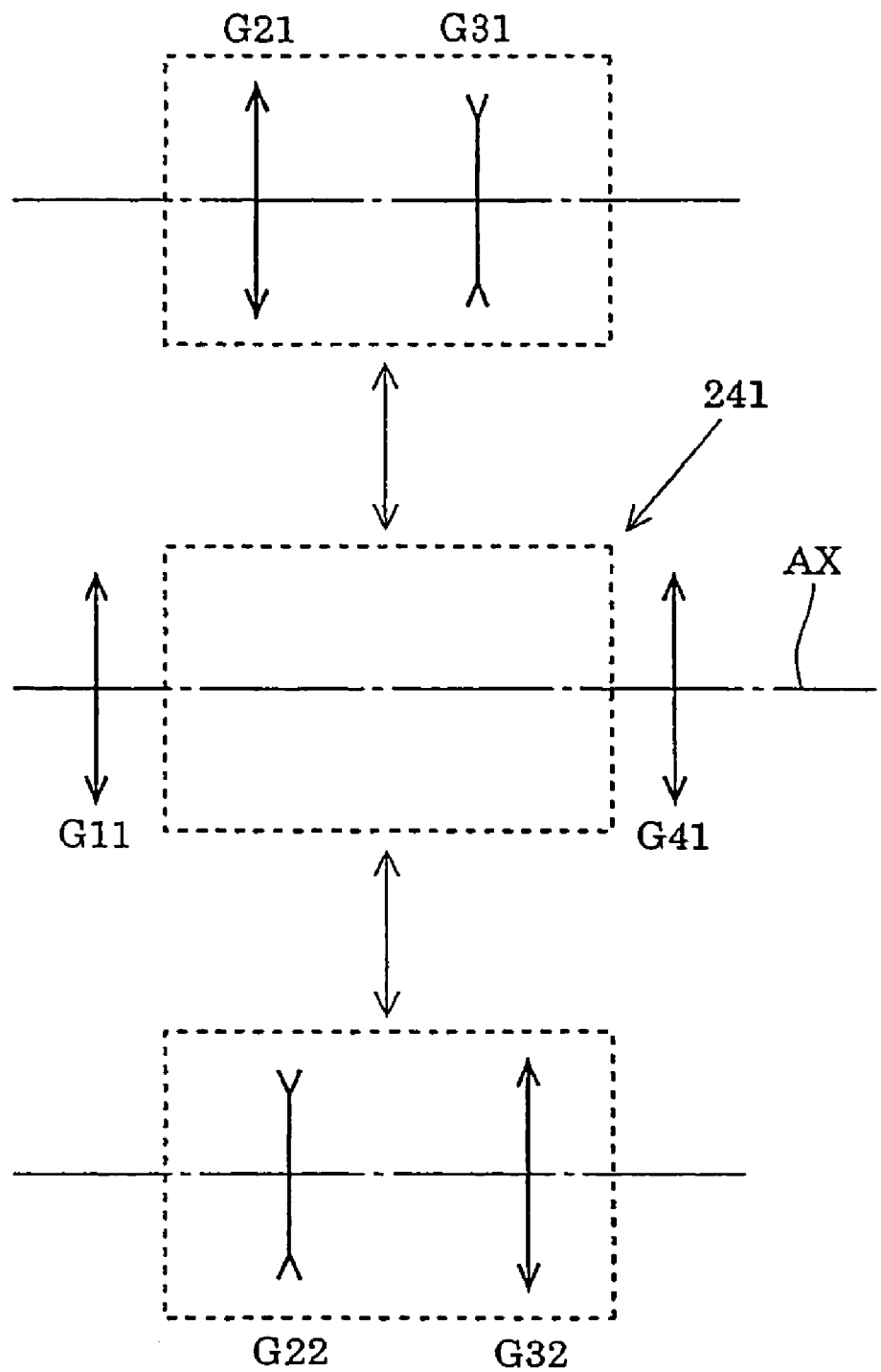
FIG. 16 is a diagram schematically showing the second exemplary modification of the magnification changing optical system.

FIG. 16 is a diagram schematically showing a second exemplary modification of the magnification changing optical system. Referring to FIG. 16, the magnification changing optical system 241 of the second exemplary modification includes, from the light source side (left side in the drawing), a first lens group G11 having positive refractive power and a fourth lens group G41 having positive refractive power, as a pair of lens groups fixed in the optical path. In addition, the magnification changing optical system 241 includes, from the light source side, a second lens group G21 having positive refractive power and a third lens group G31 having negative refractive power, as a first pair of lens groups that is insertable into and removable from the optical path. Moreover, the magnification changing optical system 241 includes, from the light source side, a second lens group G22 having negative refractive power and a third lens group G32 having positive refractive power, as a second pair of lens groups that is insertable into and removable from the optical path.

Therefore, in the second exemplary modification, a magnification changing optical system having the first focal length can be formed by inserting the first pair of lens groups G21 and G31 into the optical path between the first lens group G11 and the fourth lens group G41. In addition, by inserting the second pair of lens groups G22 and G32 into the optical path between the first lens group G11 and the fourth lens group G41, a magnification changing optical system having the second focal length different from the first focal length can be formed.

That is, in the magnification changing optical system 241 of the second exemplary modification, unlike the magnification changing optical system 24 of the second embodiment or the magnification changing optical system 240 of the first exemplary modification as described above, the focal length changes discretely, instead of continuously. In addition, in the second exemplary modification, only a part of the lens groups is structured to be insertable and removable with respect to the optical path. However, by configuring a plurality of optical systems having different focal lengths from each other, and that are replaceable with respect to the optical path, the magnification changing optical system having a focal length that can be varied discretely can be provided.

Furthermore, in the above-described second embodiment, the microlens array (or fly's eye lens) 25 is used as an optical integrator for forming a secondary light source. However, instead of the microlens array 25, which is a wavefront split type integrator, a rod-type integrator, which is an internal reflection type optical integrator, may be used. In this case, a conjugate surface of the diffractive optical element of the illumination field forming part 23 is formed by adding a light collecting optical system closer to the mask M than the magnification changing optical system 24, and the rod-type integrator is placed such that an incident end is positioned near the conjugate surface.

In addition, a relay optical system is provided for forming on the mask M an image of the illumination field diaphragm positioned on or near the exit end surface of the rod-type integrator. In this case, the second predetermined surface becomes a pupil plane of an optical system synthesizing the magnification changing optical system 24 and the light collecting optical system, and the secondary light source is formed on the pupil plane of the relay optical system (a virtual image of the secondary light source is formed near the incident end of the rod-type integrator). In addition, the relay optical system for guiding the light beam from the rod-type integrator to the mask M becomes the light guiding optical system.

Third Embodiment

Figure 17:
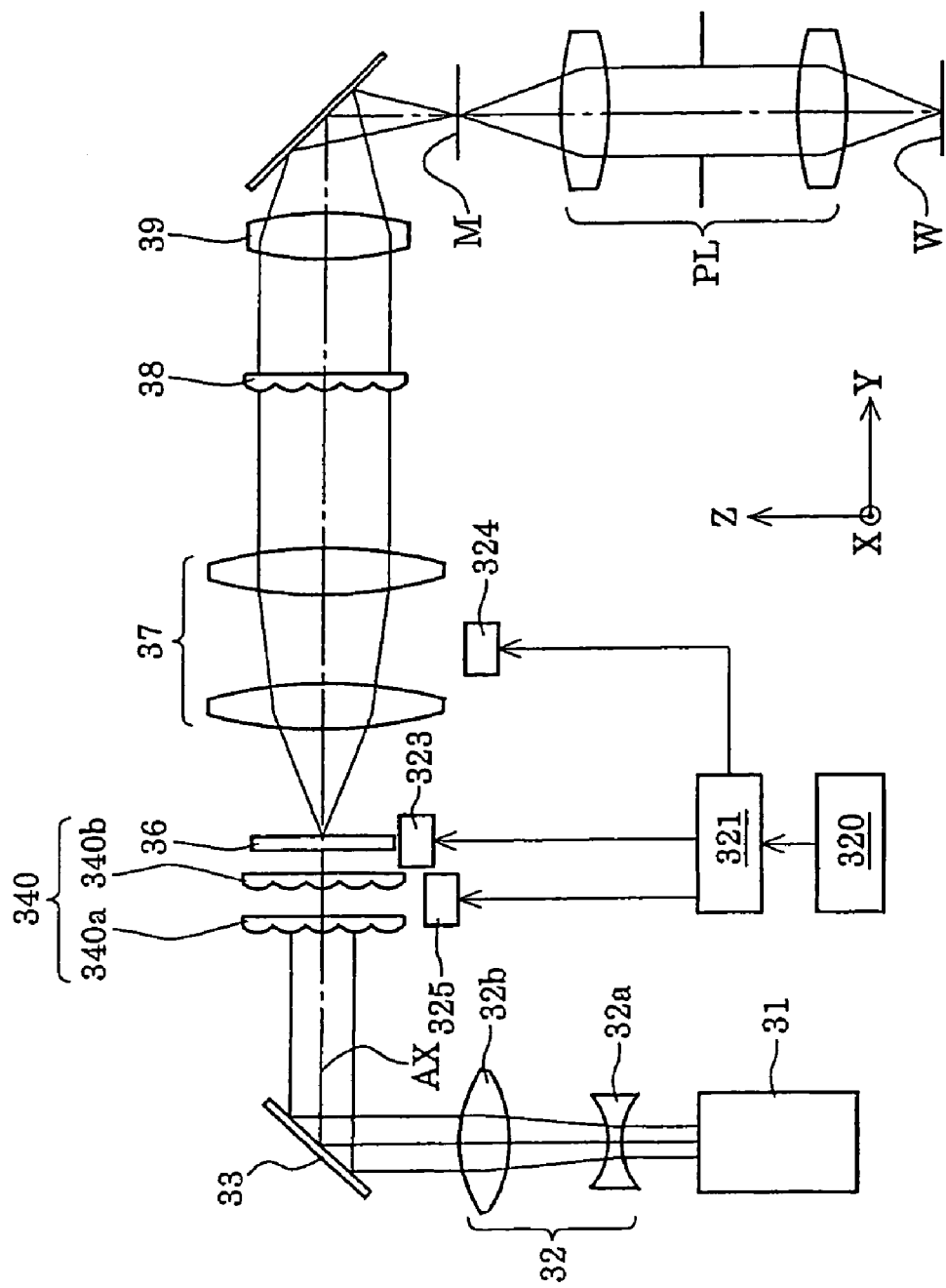
FIG. 17 is a diagram schematically showing the structure of an exposure apparatus that includes an illumination optical system according to the third embodiment of this invention.

FIG. 17 is a diagram schematically showing a structure of an exposure apparatus provided with an illumination optical system according to a third embodiment of this invention. According to the third embodiment, the diffractive optical device of the first embodiment is applied to the diffractive optical device of the illumination field formation portion 23 of the illumination optical system of the second embodiment. The following explains the third embodiment, focusing on its differences from the first embodiment.

In FIG. 17, on an optical path between a mirror 33 and a diffractive optical device 36, a micro lens array group (or a fly's eye lens group) 340 is arranged, and is constituted by a first microlens array (or a first fly's eye lens: first optical element array) 340a formed by a microlens with positive refractive power, and a second microlens array (or a second fly's eye lens: second optical element array) 340b formed by a microlens with positive refractive power. Each microlens that forms the microlens arrays 340a and 340b has a hexagonal or a rectangular cross section, and a same size. Furthermore, in the same manner as in the microlens arrays 240a and 240b of the second embodiment, the microlens arrays 340a and 340b are constituted so as to be respectively movable along the optical axis so that the back focal plane of the microlens array group 340 does not substantially move.

In other words, the distance between the first microlens array 340a and the second microlens array 340b is variable, and the microlens array group 340 constitutes a wavefront split type optical integrator having a variable focal length. The change in the focal length of the microlens array group 340 is performed by a driving system 325 that is operated based on instructions from a control system 321. Furthermore, the microlens array group 340 is arranged so that its back focal plane is positioned at an entrance surface of the diffractive optical device 36 (i.e., the entrance surface of the first diffractive optical member 36a and the second diffractive optical member 36b of the diffractive optional device 36 (similar to members 16a and 16b of the first embodiment): the first predetermined plane) or in the vicinity thereof In the third embodiment, a rectangular substantially parallel light beam which has entered the microlens array group 340 is two-dimensionally wavefront-split, and a rectangular substantially planar light source (overall rectangular planar light source formed of a plurality of light sources) is formed at the back focal plane. The light beam from the rectangular planar light source formed at the back focal plane of the microlens array group 340 forms an optical intensity distribution based on convolution of four points with a hexagon or a rectangle, i.e., a quadrupole illumination field formed of four hexagon-shaped or rectangular-shaped illumination fields centered about the optical axis AX, at the entrance surface of the microlens array 38 via the diffractive optical device 36 and the zoom lens 37.

Thus, at the back focal plane of the microlens array 38, a secondary light source having an optical intensity distribution which is substantially the same as the illumination field formed by the entrance light beam to the microlens array 38, i.e., a quadrupole secondary light source formed of four substantially planar light sources in a hexagon shape or rectangular shape centered about the optical axis AX is formed. In the third embodiment, by changing the distance between the first microlens array 340a and the second microlens array 340b, the focal length of the microlens array group 340 is changed; thus, without changing the length r between the optical axis AX and the respective centers of the four planar light sources, the size φ of the respective planar light sources can be changed.

Furthermore, by changing the focal length of the zoom lens 37, the length r and the size φ are changed, and the quadrupole secondary light source can be approximately enlarged or reduced. Furthermore, in the diffractive optical device 36, by changing the rotation angles of the first diffractive optical member 36a and the second diffractive optical member 36b, respectively, the angular positions of the respective planar light sources can be independently and continuously varied. Thus, in the third embodiment as well, according to the structure which is more simplified than in the first embodiment, by independently and continuously changing the angle positions of the respective planar light sources which constitute a quadrupole secondary light source, various quadrupole secondary light sources having two-time rotational symmetry with respect to the optical axis are formed, and optimal illumination conditions can be accomplished in two directions which are perpendicular to each other at the radiation-receiving plane.

The zoom lens 37 is moved by drive system 324 (similar to FIG. 1 drive system 124) under control of control system 321. Control system 321 is supplied with information from input means 320, which can be similar to the FIG. 1 input means 120. In addition, condenser optical system 39 is provided downstream of microlens array 38, and is similar to the FIG. 1 condenser optical system 19. Light source 31 can be similar to the FIG. 1 light source 11, and beam expander 32 with lenses 32a and 32b can be similar to the FIG. 1 beam expander 12 with lenses 12a and 12b.

Furthermore, in the third embodiment, in the same manner as in the first embodiment, the diffractive optical device 36 is used, but in the same manner as in the first exemplary modification of the first embodiment, by using the diffractive optical device 160, collapse of telecentricity of the light beam incident to the microlens array 38 can be substantially avoided, and generation of illumination irregularity on the mask M (and also, on the wafer W) also can be prevented. Furthermore, in the same manner as in the second exemplary modification of the first embodiment, by using the diffractive optical device 161, generation of illumination irregularity can be prevented, and the light amount loss in the diffractive optical device 161 also can be reduced.

Additionally, in the third embodiment, both the respective first and second microlens arrays 340a and 340b are constituted by microlenses with a positive refractive power. In the same manner as in the first exemplary modification of the second embodiment, one of the microlens arrays also can be constituted by microlenses with a negative refractive power. Additionally, in the third embodiment, a microlens array group in which the focal length is variable is constituted by two microlens arrays, but a microlens array group also can be constituted by three or more microlens arrays.

Additionally, in the above-mentioned respective embodiments and the respective exemplary modifications, the diffractive optical member has a diffraction surface which is a phase type, and has a two-step surface as shown in FIG. 3B. Instead of this, an amplitude type diffraction surface also can be used, as long as light amount loss does not occur or is small. In addition, if the diffraction surface is a phase type, four steps or eight steps of the diffraction surface also can be used. Furthermore, a blazed diffractive surface (with a sawtooth-shaped cross section) also can be formed at the diffraction surface.

Figure 18A:
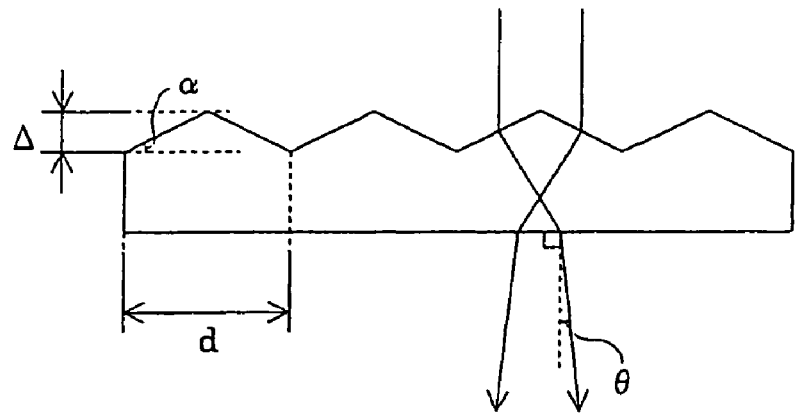
FIG. 18A is a diagram schematically showing a structure of a refractive optical device according to each embodiment and exemplary embodiment, as opposed to a diffractive optical device.
Figure 18B:
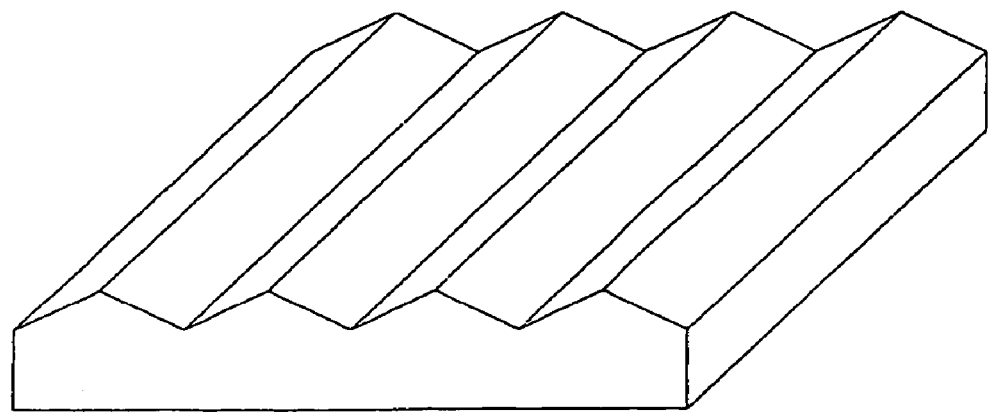
FIG. 18B is a perspective view schematically showing a structure of the refractive optical device according to each embodiment and exemplary embodiment, and is a perspective view of a part of the refractive surface.

Additionally, in the above-mentioned respective embodiments and exemplary modifications, a diffractive optical member is used which forms a four-point-shaped light beam or a quadrupole light beam in a far field by converting the entrance light beam into four light beams. However, a refractive optical member also can be used. In this case, the diffraction surface of the diffractive optical member of the respective embodiments and exemplary modifications can be a refraction surface as shown in FIGS. 18A and 18B. FIG. 18A is a diagram which schematically shows a structure when a diffractive optical device in the respective embodiments and exemplary modifications is replaced with as a refractive optical device, and is a cross-sectional view of a refraction surface. FIG. 18B is a perspective view of part of the refraction surface. As shown in FIGS. 18A and 18B, the refraction surface of the refractive optical member has the shape of a roof prism array in which roof prisms having ridge lines extended in the same direction as a groove direction of the diffraction surface of the diffractive optical member are densely arranged in a one-dimensional direction perpendicular to the groove direction. In the same manner as in the microlens array and the diffractive optical element, this type of roof prism array can be obtained, e.g., by etching a light transmissive substrate (quartz glass, fluorite, etc.).

As shown in FIG. 18A, when angle a formed by an oblique surface of the roof prism array and a plane perpendicular to the optical axis, and an index of refraction of the light transmissive substrate in which the roof prism array is formed is n, the refraction angle θ of the light beam which is refracted by the roof prism array substantially satisfies a relationship of $\theta \approx (n-1)\alpha$.

As an example, if the wavelength λ of the exposed light is 193 nm, if the pitch d of the roof prism array is equal to 0.1 mm, the index of refraction n of the light transmissive substrate is equal to 1.56, the angle α of the roof prism array is equal to 7°, and the gap (sag amount) Δ of the roof prism array is equal to 6.2 µm, a refraction angle θ=4° is obtained. Furthermore, the apex angle of the roof prism array is 180−2α.

Thus, if the diffraction surface of the diffractive optical device in the above-mentioned respective embodiments and exemplary modifications is replaced by a refractive optical device having a refraction surface formed of, e.g., roof prism arrays, there is an advantage that the light usage efficiency is higher. For example, if the diffraction surface of the diffractive optical device is a phase type diffractive optical element with two steps, even if the light amount loss due to the manufacturing errors is ignored, only approximately 80% diffractive efficiency is obtained; however, if the above-mentioned refractive optical device is used (excluding the effects of surface reflection at the refraction surface of the refractive optical device, absorption of a reflection prevention coating and the material inside of the optical transmissive member, and the effects due to manufacturing errors), approximately 100% light usage efficiency is obtained.

In the above-mentioned second exemplary modification, the respective first and second diffractive optical members 161a and 161b are rotatably arranged about the optical axis AX of the illumination optical system, but the rotation axis of the respective first and the second diffractive optical members also can be different from the optical axis AX.

Exemplary Modification of the First and Third Embodiments

Figure 19B:
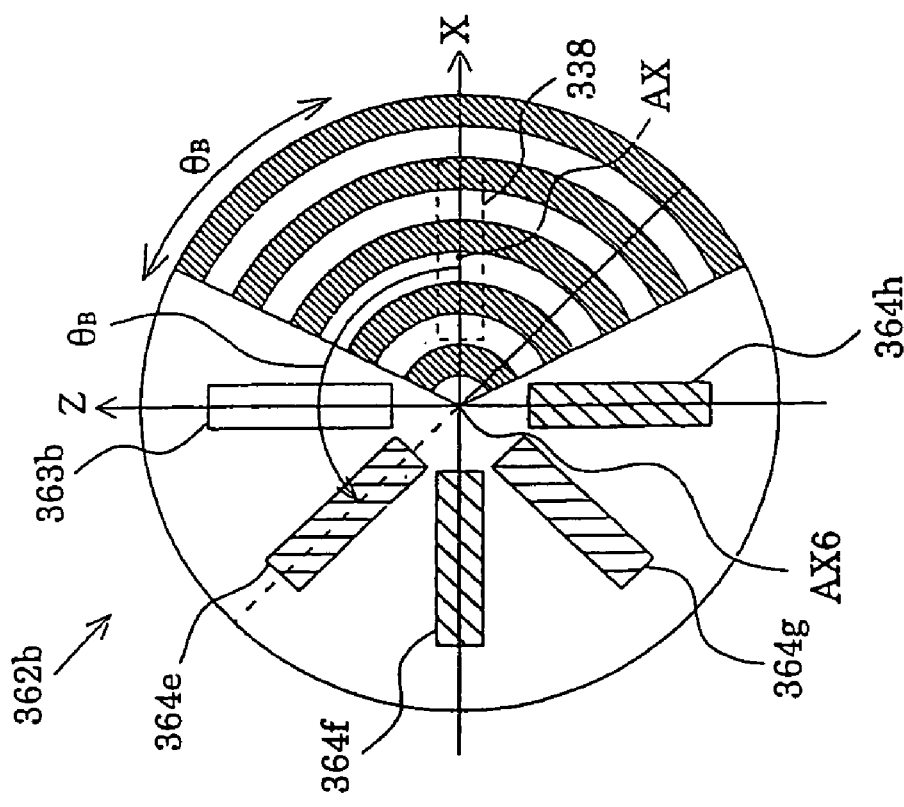
FIG. 19B is a diagram schematically showing a structure of a diffractive optical device according to an exemplary modification of the first and third embodiments, and is a diagram showing a structure of the second diffractive optical member 362b.
Figure 19A:
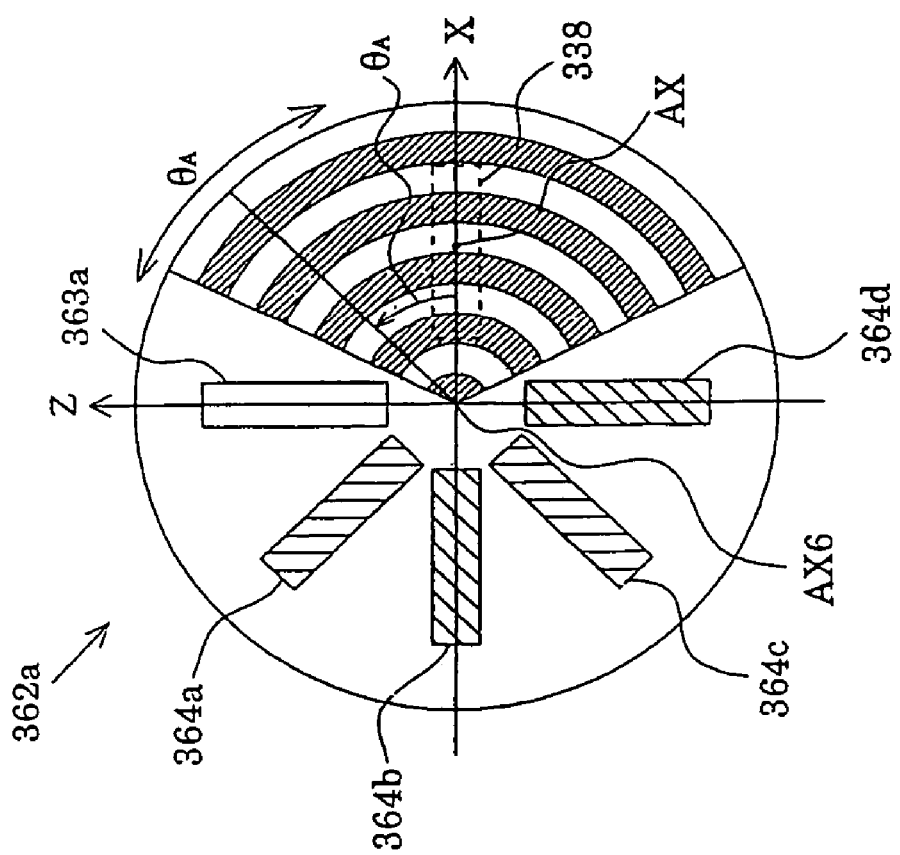

FIG. 19A is a diagram schematically showing a structure of a diffractive optical device according to an exemplary modification of the first and third embodiments and is a diagram showing a structure of a first diffractive optical member 362a. FIG. 19B is a diagram schematically showing a structure of a diffractive optical device according to an exemplary modification of the first and third embodiments and is a diagram showing a structure of a second diffractive optical member 362b. As shown in FIGS. 19A and 19B, the diffractive optical device 362 of the exemplary modification of the first and the third embodiments is constituted by the first diffractive optical member 362a which is rotatable about a rotation axis AX6 parallel to the optical axis AX, and a second diffractive optical member 362b which is rotatable about the same rotation axis AX6, and is arranged in the vicinity of the first diffractive optical member 362a along the rotation axis AX6.

Figure 20B:
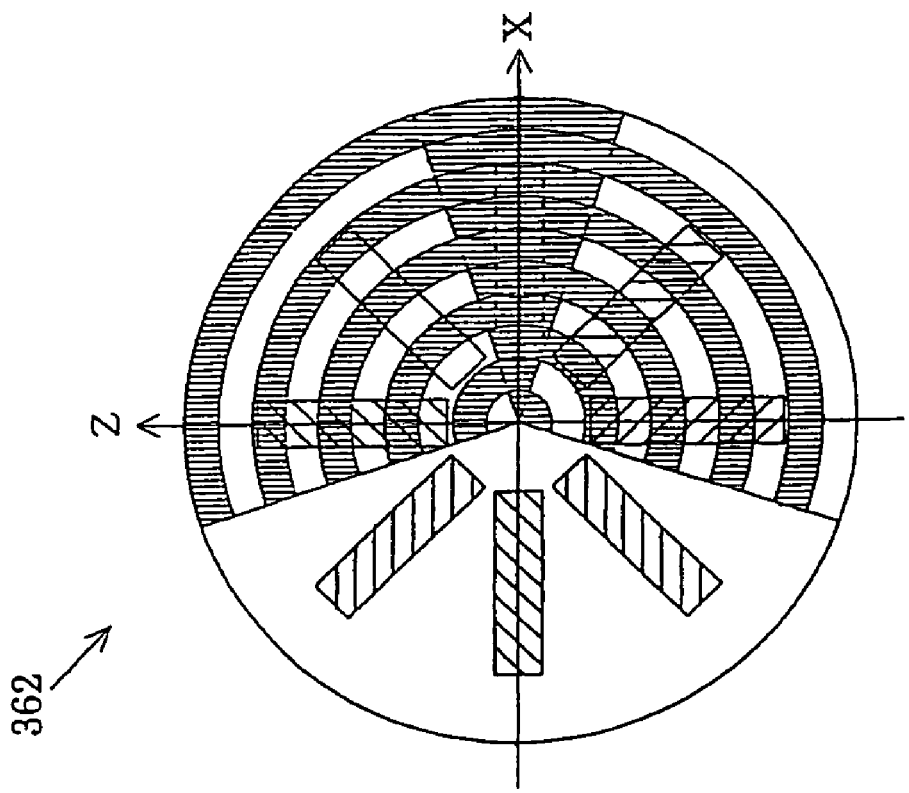
FIG. 20B is a diagram showing a form in which the first diffractive optical member and the second diffractive optical member are optically synthesized in the diffractive optical device according to an exemplary modification of the first and the third embodiments, and is a diagram showing a state in which a rotation angle $\theta_A$ of the first diffractive optical member 362a and a rotation angle $\theta_B$ of the second diffractive optical member 362b are in the same direction.
Figure 20A:
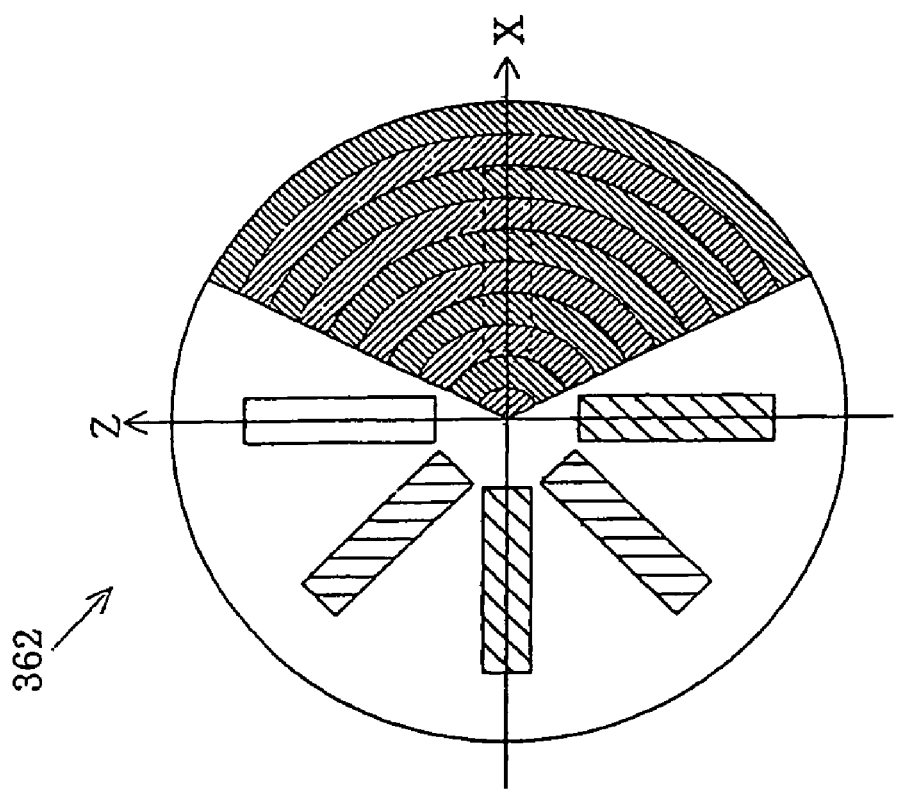
FIG. 20A is a diagram showing a form in which the first diffractive optical member and the second diffractive optical member are optically synthesized in the diffractive optical device according to an exemplary modification of the first and the third embodiments, and is a diagram showing a state in which a sector diffraction surface of the first diffractive optical member 362a and the diffraction surface of the second diffractive optical member 362b overlap with each other.

As shown by the shaded portions of FIGS. 19A and 19B, the first diffractive optical member 362a has a diffraction surface in which a fan-shaped portion of the diffraction surface includes a plurality of annular regions similar to the first diffractive optical member 166a of the second exemplary modification of the first embodiment. Similarly, the second diffractive optical member 362b has a diffraction surface in which a fan-shaped portion of the diffraction surface includes a plurality of annular regions similar to the second diffractive optical member 161b of the second exemplary modification of the first embodiment. In the same manner as in the second exemplary modification of the first embodiment, in the first diffractive optical member 362a, a diffraction surface is formed in odd-numbered regions of the fan-shaped portion starting from the center. In the second diffractive optical member 362b, a diffraction surface is formed in even-numbered regions of the fan-shaped portion starting from the center. As shown in FIGS. 20A and 20B, the diffractive optical device 362 has a configuration in which the respective first and second diffractive optical members 362a and 362b are optically combined.

In FIGS. 19A and 19B, an elongate-shaped light beam 338 enters the diffractive optical device 362, i.e., the respective first and second diffractive optical members 362a and 362b. Furthermore, in the same manner as in the second exemplary modification of the first embodiment, the light beam which has entered the diffraction surface of the first diffractive optical member 362a, which is set so that its diffractive direction forms an angle $\theta_A$ with respect to the +X axis, forms a pair of planar light sources 131 and 133 which are substantially symmetrical with respect to the optical axis AX in FIG. 2. Meanwhile, the light beam which has entered the diffraction surface of the second diffractive optical member 362b, which is set so that its diffractive direction forms an angle $\theta_B$ with respect to the +X axis, forms a pair of planar light sources 132 and 134 which are symmetrical with respect to the optical axis AX in FIG. 2.

Furthermore, in quadrupole illumination in general, in order to form a quadrupole secondary light source having two-time rotational symmetry with respect to the optical axis AX, the angle positions $\theta_A$, $\theta_B$, ($\theta_A$+180 degrees), ($\theta_B$+180 degrees) of the respective planar light sources 131–134 of FIG. 2 can be 0°<$\theta_A$<90°, 90°<$\theta_B$<180°, respectively.

FIG. 20A shows a state in which the rotation angle $\theta_A$ of the first diffractive optical member 362a and the rotation angle $\theta_B$ of the second diffractive optical member 362b are 90°, i.e., the fan-shaped diffraction surface of the first diffractive optical member 362a entirely overlaps the fan-shaped diffraction surface of the second diffractive optical member 362b. FIG. 20B shows a state in which the rotation angle $\theta_A$ of the first diffractive optical member 362a and the rotation angle $\theta_B$ of the second diffractive optical member 362b are different.

As shown in FIGS. 19A and 19B, and FIGS. 20A and 20B, it is understood that, because the rotation axis AX6 of the diffractive optical member is displaced from (but is still parallel to) the optical axis AX, the diffraction surfaces of the respective diffractive optical members 362a and 362b can be formed only within a fan-shaped region with a center angle of (90°+γ degrees). The above-mentioned angle γ is obtained according to the size and the shape of the entrance light beam 338 and the decentering amount (corresponding to the distance between the rotation axis AX6 and the optical axis AX) of the entrance light beam with respect to the rotation axis AX6.

Thus, in the diffractive optical device 362 according to the exemplary modifications of the first and third embodiments as well, by rotating the first diffractive optical member 362a about the rotation axis AX6, the angle position $\theta_A$ of the planar light source 131 of FIG. 2 and the angle position ($\theta_B$+180 degrees) of the planar light source 133 can be continuously varied. In the same manner, by rotating the second diffractive optical member 362b about the rotation axis AX6, the angle position $\theta_B$ of the planar light source 132 of FIG. 2 and the angle position ($\theta_B$+180 degrees) of the planar light source 134 can be continuously varied. That is, in the same manner as in the second exemplary modification of the first embodiment, the angle positions $\theta_A$ and $\theta_B$ of the respective planar light sources which form a quadrupole secondary light source formed at the back focal plane of the microlens array 38 can be independently and continuously varied. At this time, as is clear from FIGS. 19A and 19B, and FIGS. 20A and 20B as well, the light amount loss in the diffractive optical device 362 can be substantially avoided.

In FIGS. 19A and 19B, a diffractive optical element or a refractive optical element for another illumination condition can be arranged in the regions other than the fan-shaped regions of the respective first and second diffractive optical members 362a and 362b of the exemplary modification of the first and third embodiments. For example, in the first diffractive optical member 362a shown in FIG. 19A, a light transmissive portion 363a and a plurality of diffractive optical elements (or refractive optical elements) 364a–364d are arranged. In the second diffractive optical member 362b shown in FIG. 19B, a light transmissive portion 363b and a plurality of diffractive optical elements (or refractive optical elements) 364e–364h are arranged. Here, as the diffractive optical element(s), a device(s) can be used which diffract an entrance light beam and convert it to a plurality of points, such as two points or four points, or to a ring-shaped light beam, in a far field of the diffractive optical element(s).

Here, the light beam having a predetermined angular distribution enters the diffractive optical device 362 through the diffractive optical element 34, so if a diffractive optical element which converts the entrance light beam to a two-point shape is arranged on the illumination optical path, a dipole illumination field is formed on the entrance surface of the microlens array 38. If a diffractive optical element which converts the entrance light beam to a four-point shape is arranged on the illumination optical path, a quadrupole illumination field is formed at the entrance surface of the microlens array 38. If a diffractive optical element which converts the entrance light beam to a ring shape is arranged on the illumination optical path, an annular illumination field is formed at the entrance surface of the microlens array 38.

At this time, if one of the diffractive optical elements (or refractive optical elements) 364a–364d arranged in the first optical member 362a is used (i.e., any of these is arranged on the illumination optical path), in the second diffractive optical member 362b, the light transmissive portion 363b is arranged on the illumination optical path. Furthermore, if any of the diffractive optical elements (or refractive optical elements) 364e–364h arranged in the second diffractive optical member 362b is used (i.e., any of these is arranged on the illumination optical path), the light transmissive portion 363a of the first diffractive optical member 362a is arranged on the illumination optical path. Furthermore, if the light transmissive portion 363a of the first diffractive optical member 362a and the light transmissive portion 363b of the second diffractive optical member 362b are arranged on the illumination optical path, no diffraction operation is performed. In this case, a circular illumination field is formed at the entrance surface of the microlens array 38, and the microlens array 38 forms a circular secondary light source; thus, normal circular illumination can be performed.

As is clear from FIGS. 20A and 20B, the center-most diffraction surface of the first diffractive optical member 362a and the center-most diffraction surface of the second diffractive optical member 362b do not overlap the region through which the entrance light beam 338 passes; thus, it is not necessary to make these surfaces diffraction surfaces. Furthermore, in the diffractive optical device 362 of the exemplary modifications shown in FIGS. 19A and 19B, and FIGS. 20A and 20B, an elongate-shaped light beam 338 enters the refractive optical device 362. However, this entrance light beam is not limited to a rectangular shape, and can be a square shape as described in the above-mentioned embodiments, or any shape can be used.

Additionally, the diffractive optical device 362 of the exemplary modifications shown in FIGS. 19A and 19B, and FIGS. 20A and 20B, in the same manner as in the exemplary modification shown in FIG. 18, also can be modified to be a refractive optical device having a refraction surface. Furthermore, in the diffractive optical device 362 of the exemplary modifications shown in FIGS. 19A and 19B, and FIGS. 20A and 20B, a diffraction surface is arranged within one fan-shaped region of the respective diffractive optical members 362a and 362b, but a plurality of fan-shaped regions, each having a different diffraction surface also can be arranged in the respective diffractive optical members 362a and 362b. In this case, it is preferable to arrange the different diffraction surfaces with different pitches (in the case of refractive optical members, a different index of refraction of the light beam) for the respective fan-shaped regions in the respective diffractive optical members 362a and 362b.

Furthermore, in the above-mentioned first and third embodiments, light beams from a quadrupole secondary light source formed via the microlens array 18 (38) are collected by the condenser optical system 19 (39), which functions as a light guide optical system, and are overlappingly illuminated onto a mask M. However, an illumination field stop (mask blind) and a relay optical system which forms an image of the illumination field stop on the mask M also can be arranged between the condenser optical system 19 (39) and the mask M. In this case, the light guide optical system is constituted by the condenser optical system 19 (39) and a relay optical system. The condenser optical system 19 (39) collects light beams from the secondary light source and illuminates the illumination field stop in an overlapping manner. The relay optical system forms an image of an aperture portion (light transmissive portion) of the illumination field stop on the mask M.

Furthermore, in the above-mentioned respective embodiments, a microlens array is used as an optical integrator which forms a quadrupole secondary light source, but instead of a microlens array which is a wavefront split type integrator, a rod type integrator also can be used as an internal surface reflective type optical integrator. In this case, as a second optical system, a light collecting optical system is added closer to the mask M than the zoom lens 17 (37), a conjugate plane of the diffractive optical device 16 (36) is formed, and a rod type integrator is arranged so that its entrance end is positioned in the vicinity of the conjugate plane.

Furthermore, a relay optical system is provided which forms on the mask M an image of the illumination field stop arranged at the exit end surface or in the vicinity of the exit end surface of the rod type integrator. In the case of this structure, the second predetermined surface is a pupil plane of a composite optical system of the zoom lens 17 (37) and the above-mentioned light collecting optical system, and a secondary light source is formed at the pupil plane of the relay optical system (a virtual image of the secondary light source is formed in the vicinity of the entrance and of the rod type integrator). Furthermore, a relay optical system which introduces the light beam from the rod type integrator to the mask M becomes a light guide optical system. Furthermore, the illumination optical system of the above-mentioned first through third embodiments may have a conical axicon system.

Furthermore, in the exposure apparatus according to the above-mentioned embodiment, by illuminating a mask (reticle) by the illumination optical system (illumination process) and exposing a pattern formed on the mask onto a photosensitive substrate, using a projection optical system (exposure process), a micro device (for example, a semiconductor element, an imaging element, a liquid crystal display element, a thin-film magnetic head, or the like) can be manufactured. One example of such a manufacturing method is explained with reference to the flowchart of FIG. 21 when a semiconductor device as a micro device is obtained by forming a predetermined circuit pattern on a wafer or the like as a photosensitive substrate, using an exposure apparatus of any of the above-mentioned embodiments.

Figure 21:
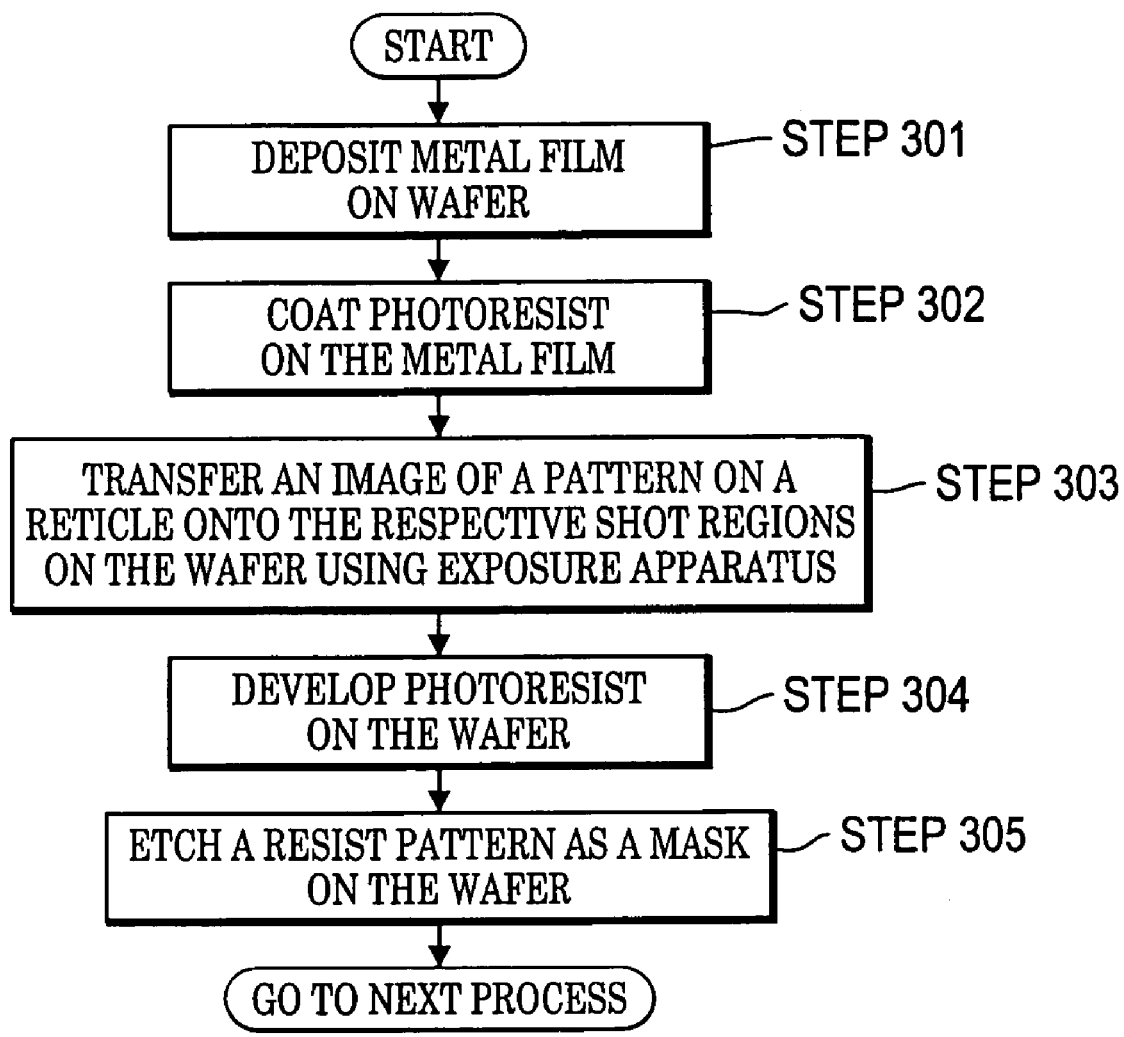
FIG. 21 is a flow chart of a method for obtaining a semiconductor device as a micro device.

First, in step 301 of FIG. 21, a metal film is deposited on one lot of wafers. In the following step 302, a photoresist is coated on the metal film on the lot of wafers. Then, in step 303, by using the exposure apparatus of any of the above-mentioned embodiments, an image of a pattern on a mask is sequentially exposed and transferred to the respective shot regions on the lot of wafers via the projection optical system. After that, in step 304, the photoresist on the lot of wafers is developed. Then, in step 305, etching is performed of a resist pattern that is used as a mask on the lot of wafers, so a circuit pattern corresponding to a pattern on the mask is formed in the respective shot regions on the respective wafers. Then, by further forming a circuit pattern of an upper layer or the like, a device such as a semiconductor element or the like is manufactured. According to the method of manufacturing a semiconductor device, a semiconductor device having an extremely fine circuit pattern can be obtained with good throughput.

Figure 22:
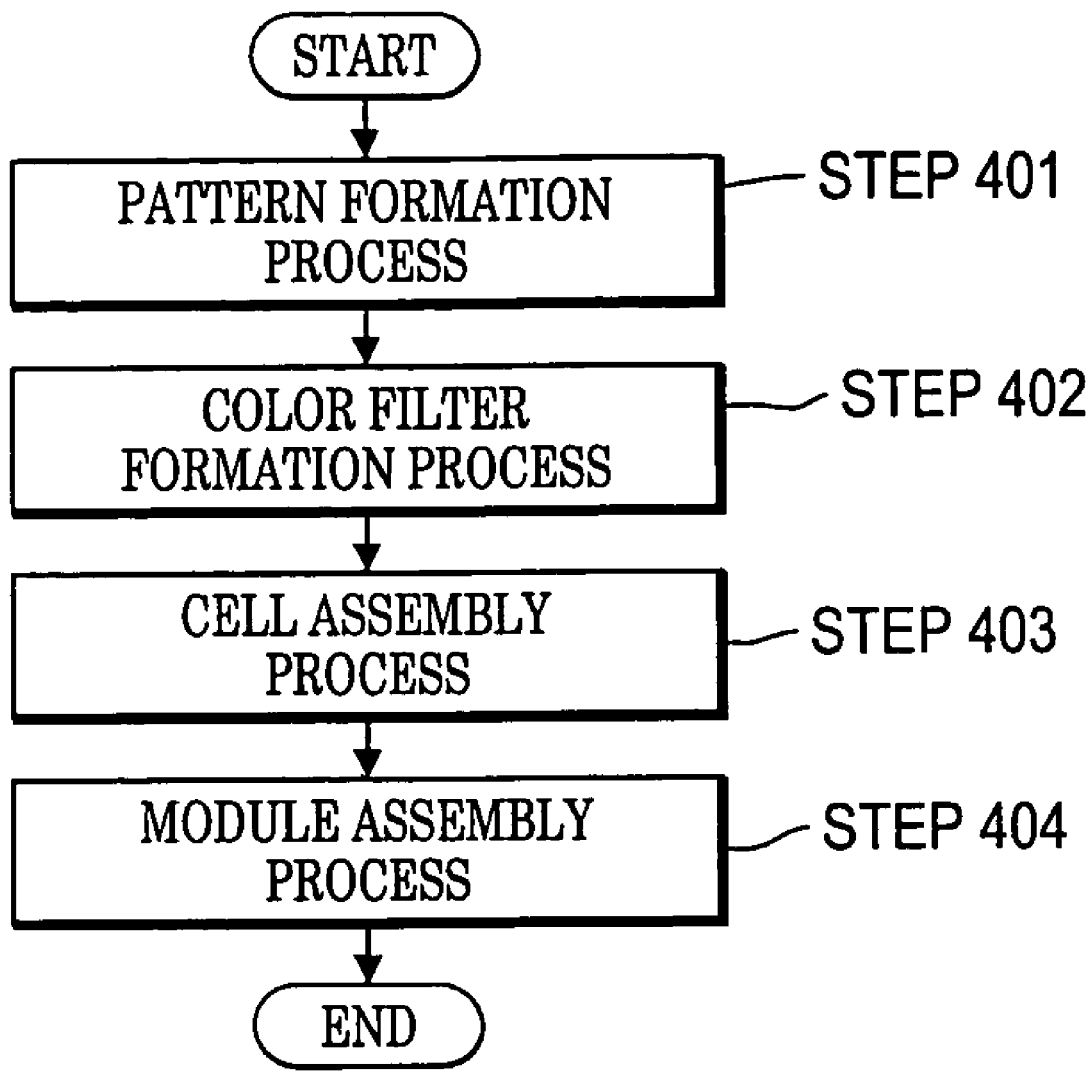
FIG. 22 is a flow chart of a method for obtaining a liquid crystal display element as a micro device.

Furthermore, in the exposure apparatus of the above-mentioned embodiment, by forming a predetermined pattern (a circuit pattern, an electrode pattern, or the like) on a plate (glass substrate), a liquid crystal display element as a micro device also can be obtained. The following explains an example of this method with reference to the flowchart of FIG. 22. In FIG. 22, in a pattern formation step 401, a so-called photolithography process is performed in which a pattern of a mask is transferred and exposed onto a photosensitive substrate (a glass substrate or the like coated by a resist) by using the exposure apparatus of any of the above-mentioned embodiments. According to this photolithography process, a predetermined pattern including a plurality of electrodes or the like is formed on the photosensitive substrate. After that, the exposed substrate goes through the respective steps such as a developing step, an etching step, a resist removal step, or the like, so a predetermined pattern is formed on the substrate, and the substrate is moved to the following color filter formation step 402.

Next, in the color filter formation step 402, a color filter is formed in which a plurality of groups of three dots corresponding to R (Red), G (Green), B (Blue) are arranged in a matrix, or a plurality of groups of filters of three stripes of RGB are arranged in a horizontal scanning line direction. Then, after the color filter formation step 402, a cell assembly step 403 is performed. In the cell assembly step 403, a liquid crystal panel (liquid crystal cell) is assembled by using a substrate having a predetermined pattern which was obtained in the pattern formation step 401, a color filter which was obtained in the color filter formation step 402, or the like. In the cell assembly step 403, for example, liquid crystal material is filled between a substrate having a predetermined pattern which was obtained in the pattern formation step 401 and the color filter which was obtained in the color filter formation step 402, and a liquid crystal panel (liquid crystal cell) is manufactured.

After that, in a module assembly step 404, by mounting parts such as a back light, an electric circuit which performs a display operation of the assembled liquid crystal panel (liquid crystal cell), or the like, the assembly is completed as a liquid crystal display element. According to the above-mentioned method of manufacturing a liquid crystal display element, a liquid crystal display element with an extremely fine circuit pattern can be obtained with good throughput.

Additionally, in the above-mentioned embodiments, this invention was explained by using an example of a projection exposure apparatus with an illumination optical system, but this invention also can be applied to a general illumination optical system which illuminates a radiation-receiving plane other than a mask.

As explained above, in the illumination optical system of some aspects of this invention, angle positions of the respective planar light sources which form a quadrupole secondary light source which is formed at an illumination pupil plane, can be independently and continuously varied by the operation of the diffractive optical device (or refractive optical device). As a result, by using a simplified structure without V-shaped axicon systems, various quadrupole secondary light sources with two-time rotational symmetry with respect to the optical axis can be formed, and an illumination condition which is different in two perpendicular directions on a radiation-receiving plane can be accomplished.

Additionally, in the exposure apparatus in which the illumination optical system of some aspects of this invention is incorporated and the exposure method using such an illumination optical system, by using an illumination optical system in which various quadrupole secondary light sources with two-time rotational symmetry with respect to the optical axis are formed, and an illumination condition which is different in two perpendicular directions on an irradiated plane is accomplished, under the illumination condition which is optimal to a mask, a mask pattern can be reliably transferred onto a photosensitive substrate.

Furthermore, in the illumination optical system of some aspects of this invention, an angular light beam forming part is constituted by, e.g., a microlens array group with a variable interval, and there is no optical system between this microlens array group and an illumination field forming part (diffractive optical element); thus, the total number of the light transmissive members can be decreased and an illumination optical path also can be shortened in the angular light beam forming part and the illumination field forming part. As a result, as an illumination optical system overall, the total number of the optical transmissive members is reduced, and an illumination optical path is shortened; thus, a space to be purged becomes small, and the light amount loss due to light absorption on the illumination optical path can be reduced.

Thus, in some aspects of this invention, according to the simplified structure in which the total number of components is reduced and the illumination optical path is shortened, the device can be made compact; thus, the light amount loss due to light absorption on the illumination optical path can be reduced, and various modified illuminations such as annular illumination and quadrupole illumination can be performed. Additionally, by using an illumination optical system in which the light amount loss due to light absorption on the illumination optical path can be reduced and various modified illuminations such as annular illumination and quadrupole illumination can be performed, a mask pattern can be reliably transferred onto a photosensitive substrate under the optimal illumination condition for the mask. In addition, a desired micro device can be manufactured.

While the invention has been described with reference to preferred embodiments thereof, which are exemplary, it is to be understood that the invention is not limited to the preferred embodiments or constructions. The invention is intended to cover various modifications and arrangements.

In addition, while the various elements of the preferred embodiments are shown in various combinations and configurations, that are exemplary, other combinations and configurations, including more, less or only a single element, are also within the spirit and scope of the invention.

What is claimed is:

1. A diffractive optical device for use in an illumination optical system that illuminates an illuminated surface, and that converts an incident light beam into multiple light beams to form a secondary light source having a multipole light intensity distribution on an illumination pupil plane, the diffractive optical device comprising:
   a first diffractive optical member that is rotatable about a first axis that intersects the first diffractive optical member and that is parallel to an optical axis of the illumination optical system; and
   a second diffractive optical member that is rotatable about a second axis that is parallel to the optical axis, and that is displaced from the first axis in an orthogonal plane that is orthogonal to the optical axis so that the second diffractive optical member is adjacent to the first diffractive optical member.

2. The diffractive optical device according to claim 1, wherein the first axis and the second axis have a positional relationship in the orthogonal plane that is symmetrical with respect to the optical axis.

3. The diffractive optical device according to claim 1, further comprising:
   a third diffractive optical member that is rotatable about a third axis that is parallel to the optical axis, the third diffractive optical member is positioned within the orthogonal plane so as to be adjacent to at least one of the first diffractive optical member and the second diffractive optical member; and
   a fourth diffractive optical member that is rotatable about a fourth axis that is parallel to the optical axis, the fourth diffractive optical member is positioned within the orthogonal plane so as to be adjacent to the third diffractive optical member, and adjacent to at least one of the second diffractive optical member and the first diffractive optical member.

4. The diffractive optical device according to claim 3, wherein a rectangle formed by connecting the first axis, the second axis, the third axis and the fourth axis within the orthogonal plane forms a square centered on the optical axis.

5. An illumination optical system for illuminating an illuminated surface, comprising the diffractive optical device of claim 1, that forms a multipole light beam centered about an optical axis of the illumination optical system in a far field by converting the incident light beam into multiple light beams to form a secondary light source having a multipole light intensity distribution on an illumination pupil plane.

6. The illumination optical system according to claim 5, further comprising:
   a light source that supplies the light beam;
   an angular light beam forming device that causes the light beam supplied from the light source to enter a first predetermined surface by converting the light beam into a light beam having plural angular components with respect to the optical axis;
   an illumination field forming device that includes the diffractive optical device and that forms four illumination fields about the optical axis on a second predetermined surface based on the light beam having plural angular components that entered the first predetermined surface;
   an optical integrator that forms the multipole secondary light source having substantially the same light intensity distribution as the multiple illumination fields, based on the light beam from the multiple illumination fields formed on the second predetermined surface; and
   a light guiding optical system that guides the light beam from the optical integrator to the illuminated surface.

7. The illumination optical system according to claim 6, wherein the angular light beam forming device includes a dispersing light beam forming element that converts a substantially parallel light beam supplied from the light source into a light beam that disperses at plural angles with respect to the optical axis, and a first optical system that collects the dispersed light beam formed though the dispersing light beam forming element and guides the dispersed light beam to the first predetermined surface.

8. The illumination optical system according to claim 7, wherein the first optical system includes a first magnification changing optical system that changes a size of each planar light source without changing a distance between the optical axis and a center of each of the planar light sources.

9. The illumination optical system according to claim 8, wherein the first magnification changing optical system includes an afocal lens that makes the dispersing light beam forming element and the first predetermined surface substantially optically conjugate.

10. The illumination optical system according to claim 6, wherein:
   the angular light beam forming device includes a wavefront split type optical integrator formed from a first optical element array having a plurality of first unit optical elements arranged two-dimensionally, and a second optical element array having a plurality of second unit optical elements arranged to optically correspond to the plurality of first unit optical elements; and
   a back focal plane of the wavefront split type optical integrator is positioned on or near the first predetermined surface.

11. The illumination optical system according to claim 10, wherein a gap between the first optical element array and the second optical element array is variable so as to change a size of each planar light source without changing a distance between the optical axis and the center of each of the planar light sources.

12. The illumination optical system according to claim 6, further comprising a second optical system that directs the light beam from the diffractive optical device to the second predetermined surface.

13. The illumination optical system according to claim 12, wherein the second optical system includes a second magnification changing optical system that expands or reduces the secondary light source.

14. The illumination optical system according to claim 13, wherein the second magnification changing optical system includes a zoom lens that makes the diffractive optical device and the second predetermined surface have a Fourier transform relationship.

15. The illumination optical system according to claim 6, wherein the diffractive optical device forms a quadrupole light beam centered about an optical axis of the illumination optical system in a far field by converting the incident light beam into four light beams to form a secondary light source having a quadrupole light intensity distribution on an illumination pupil plane.

16. An exposure apparatus, comprising:
an illumination optical system according to claim 5; and
a projection optical system which projects and exposes a predetermined pattern arranged at the radiation-receiving plane onto a photosensitive substrate.

17. An exposure method, in which a predetermined pattern is illuminated via the illumination optical system according to claim 5, and an image of the pattern which was illuminated is projected and exposed onto a photosensitive substrate.

18. A device manufacturing method, comprising the steps of:
illuminating a predetermined pattern via the illumination optical system according to claim 5;
projecting an image of the pattern onto a photosensitive substrate; and
developing the photosensitive substrate.

19. A diffractive optical device for use in an illumination optical system that illuminates an illuminated surface, and that converts an incident light beam into multiple light beams to form a secondary light source having a multipole light intensity distribution on an illumination pupil plane, the diffractive optical device comprising:
a first diffractive optical member that is rotatable about a predetermined axis that intersects the first diffractive optical member and that is parallel to an optical axis of the illumination optical system; and
a second diffractive optical member that is rotatable about the predetermined axis; wherein:
in the first diffractive optical member and the second diffractive optical member, at least a part of annular regions defined by a plurality of concentric circles are formed so as to be substantially the same;
in the first diffractive optical member, diffraction surfaces are formed in odd-numbered regions starting from the center among the annular regions; and
in the second diffractive optical member, diffraction surfaces are formed in even-numbered regions starting from the center among the annular regions.

20. The diffractive optical device according to claim 19, wherein a radial dimension of the annular regions of the first and second diffractive optical members are substantially equal to each other.

21. The diffractive optical device according to claim 19, wherein entire surfaces of the first diffractive optical member and the second diffractive optical member, include the annular regions defined by the plurality of concentric circles.

22. The diffractive optical device according to claim 19, wherein:
a part of surfaces of each of the first and second diffractive optical members includes the annular regions defined by the plurality of concentric circles; and
at least one of a diffraction surface and a refraction surface for converting the incident light beam into a predetermined light beam is provided at portions of the first and second diffractive optical members where the annular regions are not provided.

23. An illumination optical system for illuminating an illuminated surface, comprising the diffractive optical device of claim 19, that forms a multipole light beam centered about an optical axis of the illumination optical system in a far field by converting the incident light beam into multiple light beams to form a secondary light source having a multipole light intensity distribution on an illumination pupil plane.

24. The illumination optical system according to claim 23, further comprising:
a light source that supplies the light beam;
an angular light beam forming device that causes the light beam supplied from the light source to enter a first predetermined surface by converting the light beam into a light beam having plural angular components with respect to the optical axis;
an illumination field forming device that includes the diffractive optical device and that forms multiple illumination fields about the optical axis on a second predetermined surface based on the light beam having plural angular components that entered the first predetermined surface;
an optical integrator that forms the multipole secondary light source having substantially the same light intensity distribution as the multiple illumination fields, based on the light beam from the multiple illumination fields formed on the second predetermined surface; and
a light guiding optical system that guides the light beam from the optical integrator to the illuminated surface.

25. The illumination optical system according to claim 24, wherein the angular light beam forming device includes a dispersing light beam forming element that converts a substantially parallel light beam supplied from the light source into a light beam that disperses at plural angles with respect to the optical axis, and a first optical system that collects the dispersed light beam formed though the dispersing light beam forming element and guides the dispersed light beam to the first predetermined surface.

26. The illumination optical system according to claim 25, wherein the first optical system includes a first magnification changing optical system that changes a size of each planar light source without changing a distance between the optical axis and a center of each of the planar light sources.

27. The illumination optical system according to claim 26, wherein the first magnification changing optical system includes an afocal lens that makes the dispersing light beam forming element and the first predetermined surface substantially optically conjugate.

28. The illumination optical system according to claim 24, wherein:
the angular light beam forming device includes a wavefront split type optical integrator formed from a first optical element array having a plurality of first unit optical elements arranged two-dimensionally, and a second optical element array having a plurality of second unit optical elements arranged to optically correspond to the plurality of first unit optical elements; and
a back focal plane of the wavefront split type optical integrator is positioned on or near the first predetermined surface.

29. The illumination optical system according to claim 28, wherein a gap between the first optical element array and the second optical element array is variable so as to change a size of each planar light source without changing a distance between the optical axis and the center of each of the planar light sources.

30. The illumination optical system according to claim 24, further comprising a second optical system that directs the light beam from the diffractive optical device to the second predetermined surface.

31. The illumination optical system according to claim 30, wherein the second optical system includes a second magnification changing optical system that expands or reduces the secondary light source.

32. The illumination optical system according to claim 31, wherein the second magnification changing optical system includes a zoom lens that makes the diffractive optical device and the second predetermined surface have a Fourier transform relationship.

33. An exposure apparatus, comprising:
an illumination optical system according to claim 23; and
a projection optical system which projects and exposes a predetermined pattern arranged at the radiation-receiving plane onto a photosensitive substrate.

34. An exposure method, in which a predetermined pattern is illuminated via the illumination optical system according to claim 23, and an image of the pattern which was illuminated is projected and exposed onto a photosensitive substrate.

35. The illumination optical system according to claim 23, wherein the diffractive optical device forms a quadrupole light beam centered about an optical axis of the illumination optical system in a far field by converting the incident light beam into four light beams to form a secondary light source having a quadrupole light intensity distribution on an illumination pupil plane.

36. A device manufacturing method, comprising the steps of:
illuminating a predetermined pattern via the illumination optical system according to claim 23;
projecting an image of the pattern onto a photosensitive substrate; and
developing the photosensitive substrate.

37. A diffractive optical device for use in an illumination optical system that illuminates an illuminated surface, and that converts an incident light beam into multiple light beams to form a secondary light source having a multipole light intensity distribution on an illumination pupil plane, the diffractive optical device comprising:
a first diffractive optical member that is rotatable about a first axis that intersects the first diffractive optical member and that is parallel to an optical axis of the illumination optical system; and
a second diffractive optical member that is rotatable about a second axis that is parallel to the optical axis,
wherein the first diffractive optical member is adjacent to the second diffractive optical member.

38. The diffractive optical device according to claim 37, wherein light from the first diffractive optical member forms a secondary light source having a first light intensity distribution on the illumination pupil plane, and
light from the second diffractive optical member forms a secondary light source having a second light intensity distribution on the illumination pupil plane.

39. The diffractive optical device according to claim 38, wherein the first light intensity distribution and the second light intensity distribution each have a rotational asymmetrical light intensity distribution.

40. The diffractive optical device according to claim 39, wherein the first light intensity distribution on the illumination pupil plane rotates about the optical axis in accordance with the rotation of the first diffractive optical member, and
the second light intensity distribution on the illumination pupil plane rotates about the optical axis in accordance with the rotation of the second diffractive optical member.

41. The diffractive optical device according to claim 40, wherein the light from the first diffractive optical member forms a secondary light source having a dipole light intensity distribution on the illumination pupil plane, and
light from the second diffractive optical member forms a secondary light source having a dipole light intensity distribution on the illumination pupil plane.

42. The diffractive optical device according to claim 41, wherein the first axis of the first diffractive optical member and the second axis of the second diffractive optical member are parallel to each other.

43. The diffractive optical device according to claim 41, wherein the first axis of the first diffractive optical member and the second axis of the second diffractive optical member are arranged on a common axis.

44. An illumination optical system for illuminating an illuminated surface, comprising:
the diffractive optical device of claim 41, that forms a multipole light beam centered about an optical axis of the illumination optical system in a far field by converting the incident light beam into multiple light beams to form a secondary light source having a multipole light intensity distribution on an illumination pupil plane.

45. An exposure apparatus, comprising:
an illumination optical system according to claim 44; and
a projection optical system which projects and exposes a pattern of a mask arranged at a radiation-receiving plane onto a photosensitive substrate.

46. An exposure method, in which a mask is illuminated via the illumination optical system according to claim 44, and an image of a pattern formed on the mask which was illuminated is projected and exposed onto a photosensitive substrate.

47. A device manufacturing method, comprising the steps of:
illuminating a predetermined pattern via the illumination optical system according to claim 44;
projecting an image of the pattern onto a photosensitive substrate; and
developing the photosensitive substrate.

* * * * *